US008615879B2

(12) United States Patent
Hibino

(10) Patent No.: US 8,615,879 B2
(45) Date of Patent: Dec. 31, 2013

(54) POSITIONING METHOD

(75) Inventor: Tomoko Hibino, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 1181 days.

(21) Appl. No.: 12/536,843

(22) Filed: Aug. 6, 2009

(65) Prior Publication Data

US 2010/0033520 A1 Feb. 11, 2010

(30) Foreign Application Priority Data

Aug. 8, 2008 (JP) ................................ 2008-205771

(51) Int. Cl.

*B21D 53/76* (2006.01)
*B23P 17/00* (2006.01)
*B41J 2/015* (2006.01)
*H01L 41/22* (2013.01)
*H04R 17/00* (2006.01)

(52) U.S. Cl.

USPC ............................ 29/890.1; 347/20; 29/25.35

(58) Field of Classification Search

USPC ........................... 29/890.1, 25.35; 347/20, 40
See application file for complete search history.

(56) References Cited

U.S. PATENT DOCUMENTS 5,266,964 A * 11/1993 Takahashi et al. .............. 347/72
5,402,159 A * 3/1995 Takahashi et al. ................ 347/9
5,512,793 A * 4/1996 Takeuchi et al. .............. 310/328
5,639,508 A * 6/1997 Okawa et al. ................. 427/100
5,650,809 A * 7/1997 Kitamura ........................ 347/55
6,024,439 A * 2/2000 Sueoka et al. .................. 347/50
6,174,051 B1 * 1/2001 Sakaida .......................... 347/72
6,176,570 B1 * 1/2001 Kishima et al. ................. 347/70
6,536,880 B2 * 3/2003 Takagi ............................ 347/72
6,575,565 B1 * 6/2003 Isono et al. ..................... 347/71
6,672,715 B2 * 1/2004 Isono et al. ..................... 347/71
6,695,439 B2 * 2/2004 Takahashi ....................... 347/72
6,773,095 B2 * 8/2004 Isono .............................. 347/72
6,808,254 B2 * 10/2004 Sakaida et al. .................. 347/71
6,945,636 B2 * 9/2005 Sakaida et al. .................. 347/68
6,979,074 B2 * 12/2005 Watanabe et al. ............... 347/50

(Continued)

FOREIGN PATENT DOCUMENTS

JP 2000-141667 A 5/2000
JP 2003-112423 A 4/2003
JP 2005-119289 A 5/2005

OTHER PUBLICATIONS

Japan Patent Office, Notification of Reasons for Refusal for Japanese Patent Application No. 2008-205771 (counterpart Japanese patent application), dispatched Oct. 9, 2012.

*Primary Examiner* — David Angwin
(74) *Attorney, Agent, or Firm* — Baker Botts L.L.P.

(57) ABSTRACT

A method of making an electronic droplet discharge head includes positioning a channel forming member and an actuator unit. The channel forming member includes a liquid chamber which communicates with a discharge port. The liquid chamber has an opening to a surface of the channel forming member. The actuator unit includes an electrode and applies discharge energy to liquid contained in the liquid chamber. The positioning method includes acquiring a position of a centroid of the liquid chamber in the surface direction based on an image of the opening; acquiring a position of a centroid of the electrode based on an image of the electrode; and positioning the channel forming member and the actuator unit based on the position of the centroids so that the liquid chamber and the electrode have a positional relationship to the surface direction.

13 Claims, 16 Drawing Sheets

(56) References Cited

U.S. PATENT DOCUMENTS

| | | | | |
|---|---|---|---|---|
| 6,979,077 | B2 * | 12/2005 | Sakaida | 347/68 |
| 7,426,872 | B2 * | 9/2008 | Dittmar et al. | 73/818 |
| 7,520,597 | B2 * | 4/2009 | Ito | 347/71 |
| 7,527,362 | B2 * | 5/2009 | Hirota | 347/70 |
| 8,226,294 | B2 * | 7/2012 | Bieberich et al. | 374/163 |
| 8,292,495 | B2 * | 10/2012 | Bieberich et al. | 374/1 |
| 8,292,502 | B2 * | 10/2012 | Bieberich et al. | 374/163 |
| 2001/0030674 | A1 * | 10/2001 | Matsuzawa et al. | 347/70 |
| 2002/0027579 | A1 * | 3/2002 | Matsuo et al. | 347/68 |
| 2004/0263582 | A1 * | 12/2004 | Sugahara | 347/68 |

* cited by examiner

POSITIONING METHOD

CROSS-REFERENCE TO RELATED APPLICATION

This application claims priority from Japanese Patent Application No. 2008-205771, filed on Aug. 8, 2008, the entire subject matter of which is incorporated herein by reference.

TECHNICAL FIELD

Aspects of the present invention relate to a positioning method of positioning a channel forming member and an actuator unit.

BACKGROUND

A method is known as an example of a method of positioning a channel forming member which includes a liquid chamber opened to the surface thereof, and an actuator unit which applies discharge energy to liquid contained in the liquid chamber.

According to this method, first, a plurality of pressure chambers (liquid chambers) are formed at a channel unit, and marks which have a predetermined positional relationship with the plurality of pressure chambers are formed. Further, a plurality of electrodes, and markers which have a predetermined positional relationship with the plurality of electrodes, are formed at the actuator unit. When the actuator unit is attached to the channel unit, the actuator unit and the channel unit are positioned relative to each other using the marks of the channel unit and the marks of the actuator unit.

If such marks are used during the positioning, there is a concern that the positioning accuracy between the liquid chambers and the electrodes would deteriorate. For example, even though the electrodes are disposed based on the marks in a step of manufacturing the actuator unit, displacement might occur during the disposition of the electrodes, so that a positional relationship between the marks and the electrodes is changed from a design positional relationship.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a positioning method of positioning a channel forming member and an actuator unit and has relatively high positioning accuracy between an electrode and a liquid chamber.

According to an exemplary embodiment of the present invention, there is provided a positioning method of positioning a channel forming member and an actuator unit, the channel forming member including a liquid chamber which communicates with a discharge port through which a droplet is discharged, the liquid chamber having an opening being opened to a surface of the channel forming member, the actuator unit including an electrode disposed on a surface thereof, the actuator unit being configured to apply discharge energy to liquid contained in the liquid chamber to be discharged from the discharge port when a drive signal is supplied to the electrode, the positioning being performed with respect to a surface direction so that the electrode faces the liquid chamber in a facing direction orthogonal to the surface direction, the positioning method comprising: taking an image of the opening of the liquid chamber; acquiring a position of a centroid of the liquid chamber in the surface direction based on the taken image of the opening; taking an image of the electrode; acquiring a position of a centroid of the electrode in the surface direction based on the taken image of the electrode; and positioning the channel forming member and the actuator unit based on the position of the centroid of the liquid chamber and the position of the centroid of the electrode so that the liquid chamber and the electrode has a positional relationship in the surface direction.

BRIEF DESCRIPTION OF THE DRAWINGS

The above and other aspects of the present invention will become more apparent and more readily appreciated from the following description of exemplary embodiments of the present invention taken in conjunction with the attached drawings, in which.

DETAILED DESCRIPTION

Exemplary embodiments of the present invention will be described below with reference to drawings.

First Exemplary Embodiment

Figure 1:
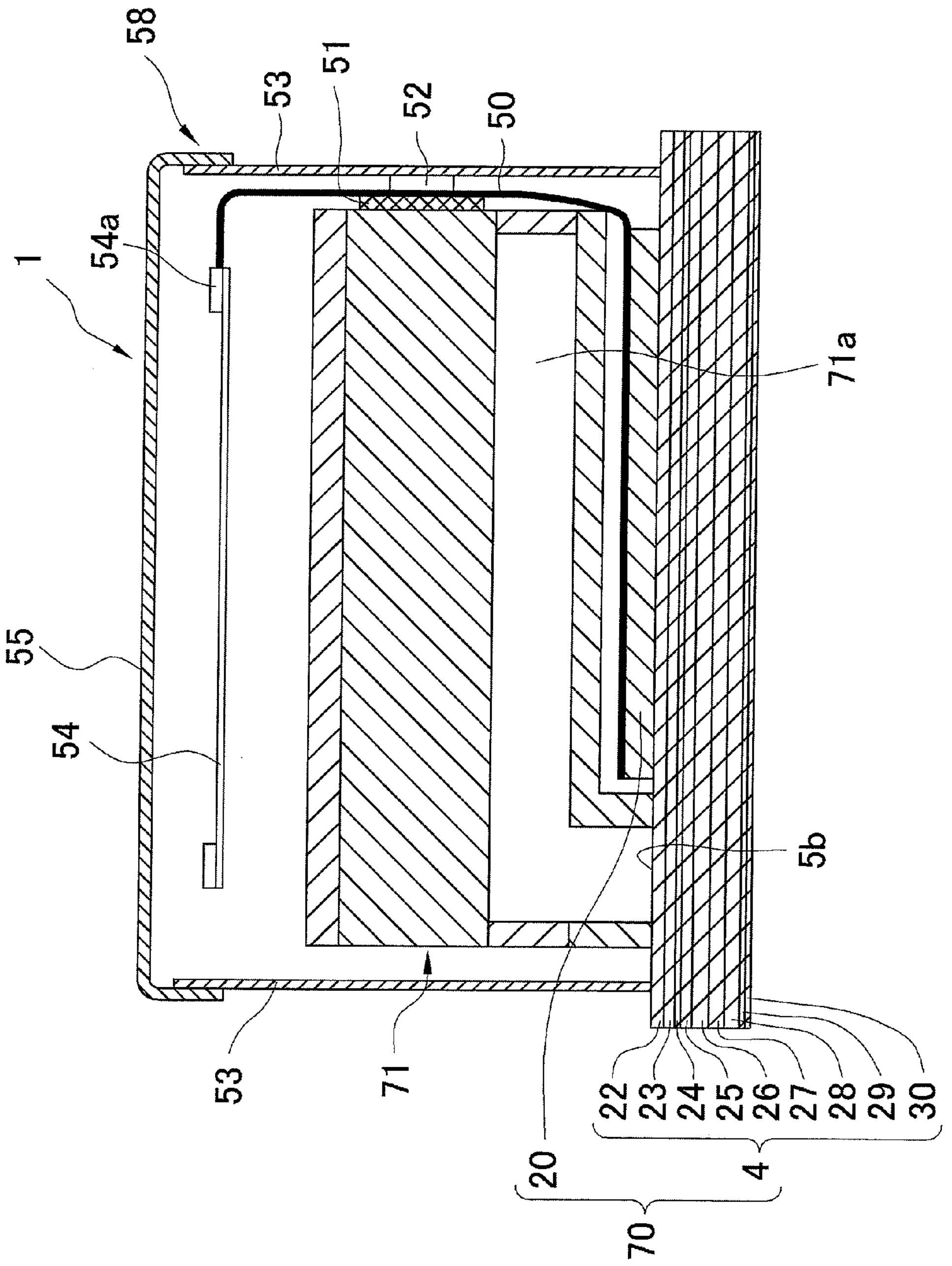
FIG. 1 is a longitudinal sectional view of an ink jet head according to a first exemplary embodiment of the present invention.

As shown in FIG. 1, an ink jet head 1 includes a head body 70 which discharges ink, a reservoir unit 71 which is disposed on an upper surface of the head body 70, a flexible printed circuit board (FPC) 50 which is electrically connected to the head body 70, and a control board 54 which is electrically connected to the FPC 50. The head body 70 includes a channel unit 4 in which an ink channel is formed, and an actuator unit 20. The reservoir unit 71 supplies ink to the channel unit 4. One end of the FPC 50 is connected to an upper surface of the actuator unit 20, and a driver IC 52, which supplies a drive signal to the actuator unit 20, is mounted on the FPC 50.

Figure 2:
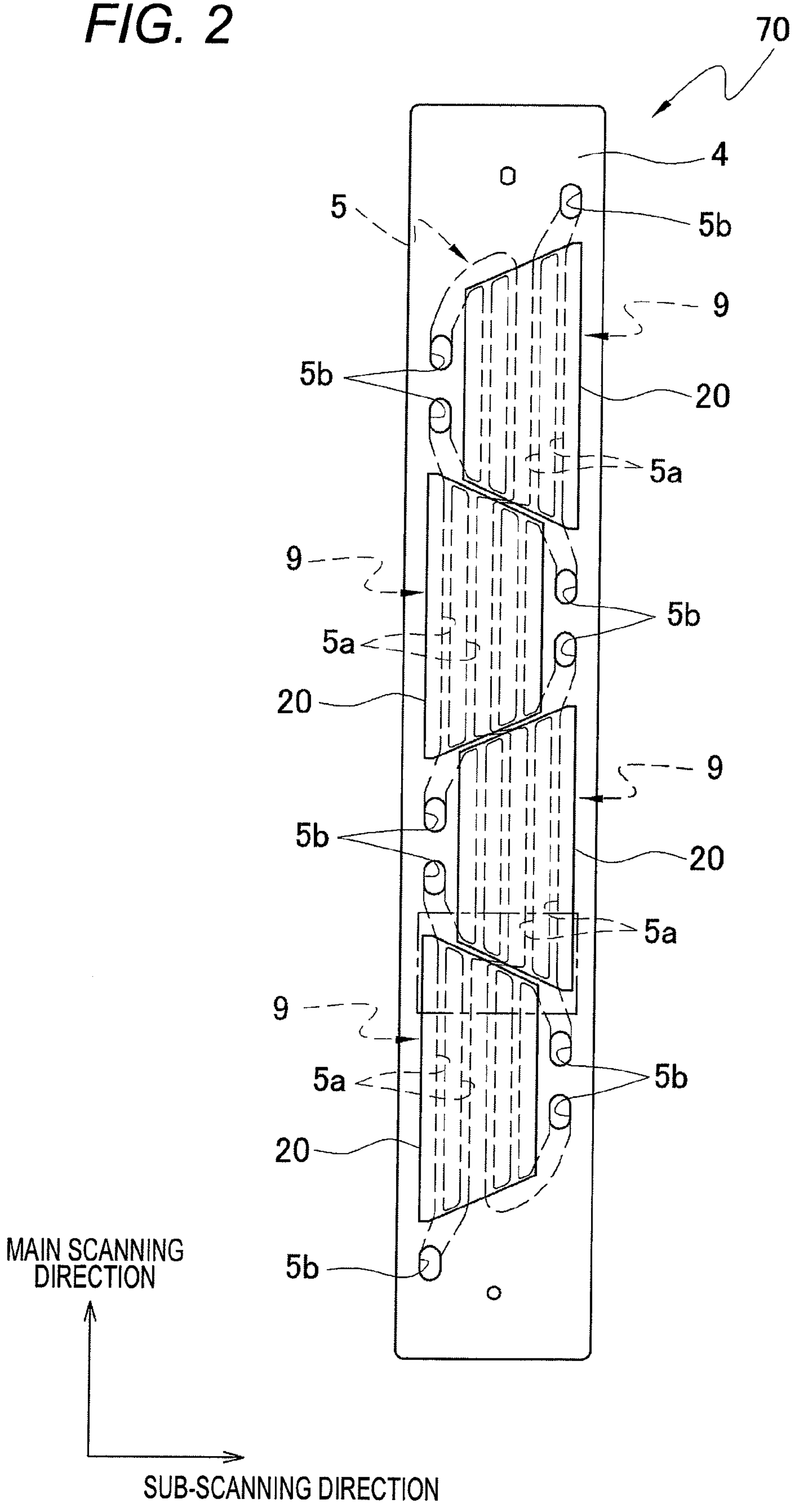
FIG. 2 is a plan view of a head body of FIG. 1.

As shown in FIG. 2, ten ink supply ports **5*b*, which respectively communicate with the internal ink channel, are formed on the upper surface of the head body 70. The ink supply ports 5*b* are opened to the upper surface of the channel unit 4. As described below, the ink channel includes a pressure chamber 10 (liquid chamber) which is formed on the upper surface of the channel unit 4, and a nozzle 8 which communicates with the pressure chamber 10 and discharges ink. Meanwhile, a filter (not shown), which covers each of the ink supply ports 5*b* and captures foreign materials mixed to ink, is provided on the upper surface of the channel unit 4**.

The control board 54 is horizontally disposed above the reservoir unit 71, and the other end of the FPC 50 is connected to the control board 54 by a connector **54*a*. Further, the driver IC 52 supplies a drive signal to the actuator unit 20 through wiring of the FPC 50 based on a command from the control board 54**.

The reservoir unit 71 is disposed above the head body 70. The reservoir unit 71 includes an ink reservoir **71*a* which stores ink therein, and the ink reservoir 71*a* communicates with the ink supply ports 5*b* of the channel unit 4. Accordingly, ink stored in the ink reservoir 71*a* is supplied to the ink channel, which is formed in the channel unit 4, through the ink supply ports 5*b***.

The actuator unit 20, the reservoir unit 71, the control board 54, the FPC 50, and the like are covered with a cover member 58. The cover member 58 includes a side cover 53 and a head cover 55. Accordingly, the incursion of ink or ink mist, which is scattered to the outside, is prevented. The cover member 58 is made of a metal material. Further, an elastic sponge 51 is provided on the side surface of the reservoir unit 71. As shown in FIG. 1, the driver IC 52 mounted on the FPC 50 is provided at a position which faces the sponge 51, so that the driver IC 52 is pressed against the inner surface of the side cover 53 by the sponge 51. Accordingly, heat generated by the driver IC 52 is transferred to the head cover 55 via the side cover 53, and is quickly dissipated to the outside through the cover member 58 which is made of metal. That is, the cover member 58 functions as a heat dissipating member.

Figure 3:
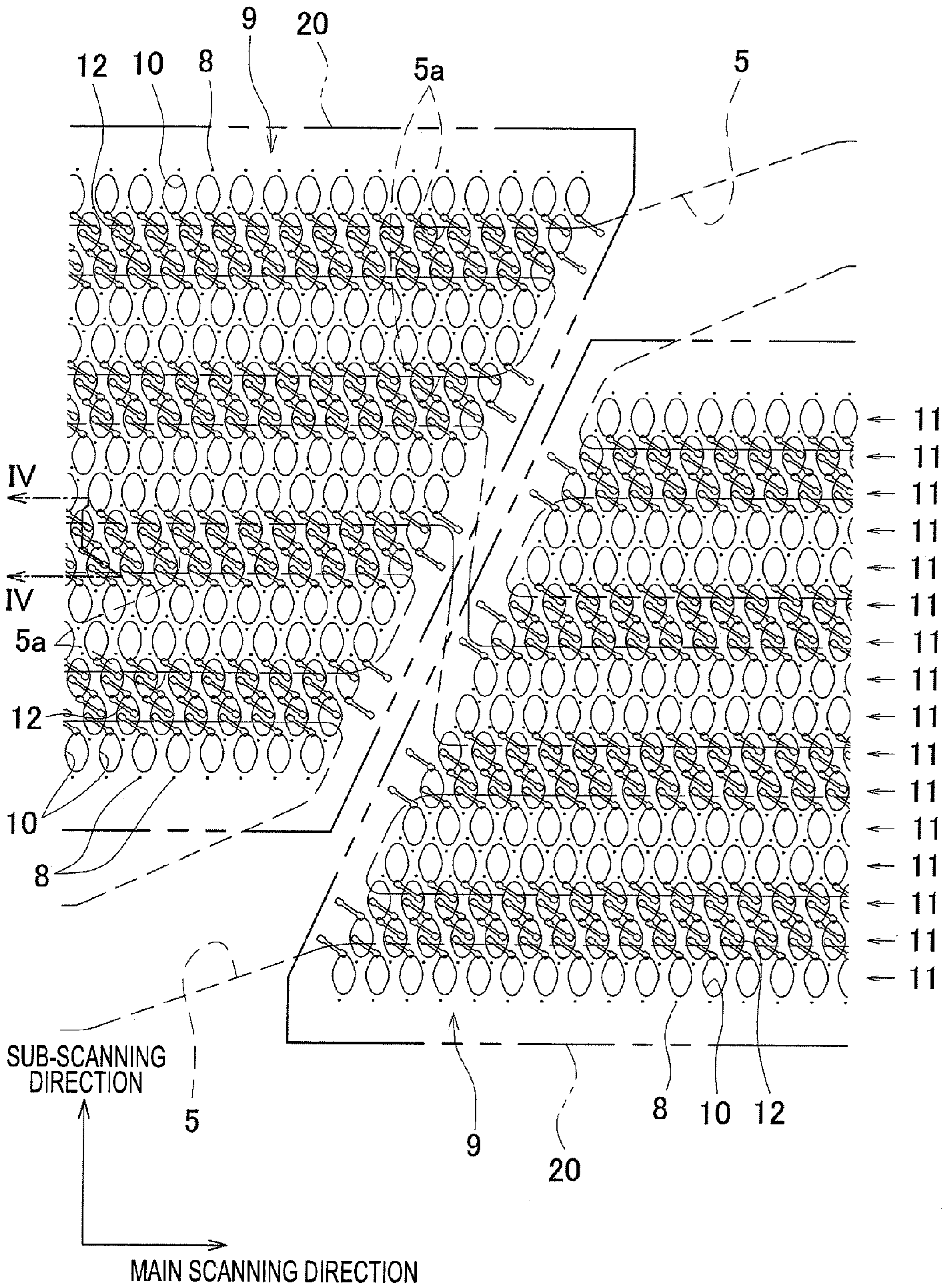
FIG. 3 is an enlarged view of a region which is surrounded by a dashed-dotted line in FIG. 2.

The head body 70 will be described in detail below. As shown in FIG. 2, the channel unit 4 has a rectangular shape, which is elongated in a main scanning direction, in plan view. As shown in FIGS. 2 and 3, the channel unit 4 includes a plurality of pressure chamber groups 9 in which the pressure chambers 10 are distributed in ranges having a trapezoidal shape in plan view. Each of the pressure chambers 10 is opened to the upper surface of the channel unit 4. Further, each of the pressure chambers 10 has a rhombic shape with rounded corners in plan view.

In this exemplary embodiment, 16 pressure chamber arrays 11 are arranged parallel to one another. Each of the pressure chamber arrays includes a plurality of pressure chambers 10 arranged at a constant interval in the longitudinal direction (main scanning direction) of the channel unit 4. The pressure chamber arrays 11 are arranged at a predetermined interval in a direction (sub-scanning direction) orthogonal to the longitudinal direction of the channel unit 4. The number of pressure chambers 10 included in the pressure chamber array 11 is gradually decreased from a long side of the pressure chamber group 9 to a short side thereof. The pressure chambers 10 are disposed in the form of a matrix in two directions (in the main scanning direction and a direction crossing the main scanning direction) so that an acute portion of a pressure chamber 10 is disposed between acute portions of adjacent two pressure chambers 10. Accordingly, as shown in FIG. 3, the plurality of pressure chambers 10 are provided so that a straight line, which connects one acute portions of the pressure chambers 10 of one pressure chamber array 11 crosses oblique sides of the pressure chambers 10 of a pressure chamber array 11 adjacent thereto in the sub-scanning direction.

As shown in FIG. 2, four trapezoidal actuator units 20 are attached to the upper surface of the channel unit 4 in two lines in zigzags so as to correspond to the disposition of the pressure chamber groups 9. Regions of the lower surface of the channel unit 4, which face the regions where the actuator units 20 are attached, form ink discharge regions where the openings (discharge ports) of the nozzles 8 are distributed. The ink discharge region has a trapezoidal shape similarly to the actuator unit 20. Similarly to the pressure chambers 10, these nozzles 8 are also disposed in the form of a matrix and form a plurality of nozzle arrays. The nozzles 8 are disposed in the ink discharge regions so as to form an image as a whole with a resolution of 600 dpi in the main scanning direction.

As shown in FIGS. 2 and 3, a manifold channel 5 communicating with the ink supply ports **5*b* and sub-manifold channels 5*a* branched from the manifold channel are formed in the channel unit 4. The manifold channel 5 extends along oblique sides of the actuator units 20 so as to intersect the longitudinal direction of the channel unit 4. In the region interposed between two actuator units 20, one manifold channel 5 is common to adjacent actuator units 20 and the sub-manifold channels 5*a* are branched from both sides of the manifold channel 5. Further, in regions facing the trapezoidal ink discharge regions, the sub-manifold channels 5*a* extend in the longitudinal direction of the channel unit 4. Both ends of the sub-manifold channel 5*a* communicate with the manifold channel 5 in the vicinity of the oblique sides of the ink discharge regions, so that the sub-manifold channels 5*a*** form a closed loop for ink discharge region.

The nozzles 8 communicate with the sub-manifold channels **5*a* through the pressure chambers 10 and apertures 12 which are throttle channels, respectively. Meanwhile, in order to easily understand the drawing, in FIG. 3, the actuator units 20 are shown by a two-dot chain line, and the pressure chambers 10, the apertures 12, and the nozzles 8, which are to be shown by a broken line at the lower portion of the actuator unit 20**, are shown by a solid line.

Figure 4:
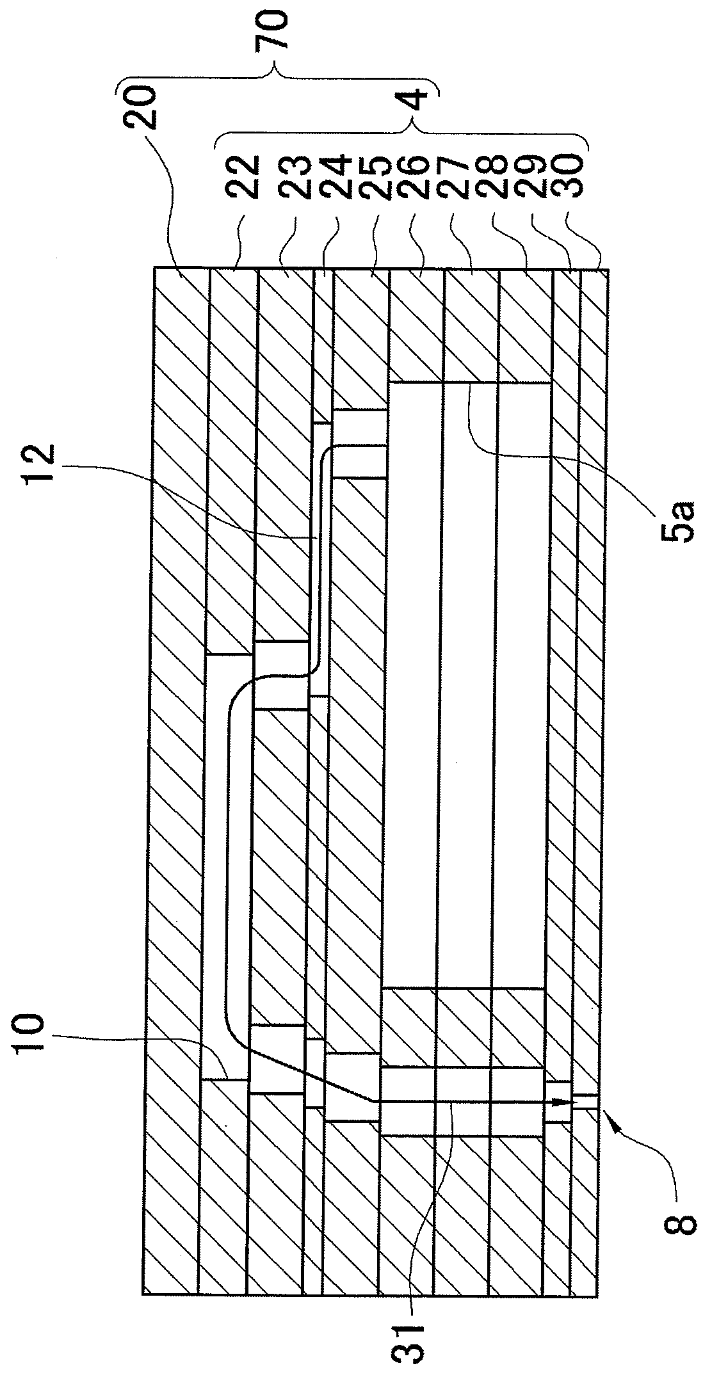
FIG. 4 is a cross-sectional view taken along a line IV-IV of FIG. 3.

The sectional structure of the head body 70 will be described below. As shown in FIG. 4, the channel unit 4 has a laminated structure including nine metal plates made of stainless steel. Specifically, the channel unit 4 includes a cavity plate 22 (channel forming member), a base plate 23, an aperture plate 24, a supply plate 25, manifold plates 26, 27, and 28, a cover plate 29, and a nozzle plate 30 laminated from above. Each of the plates 22 to 30 has an elongated rectangular shape in plan view. The actuator unit 20 is attached (fixed) to the upper surface of the cavity plate 22.

A plurality of through holes corresponding to the ink supply ports **5*b*, and a plurality of substantially rhombic through holes corresponding to the portions of the pressure chambers 10 are formed at the cavity plate 22. For each of the pressure chambers 10, a communication hole between the pressure chamber 10 and the apertures 12, a communication hole between the pressure chamber 10 and the nozzle 8, and a communication hole between the ink supply ports 5***b* and the manifold channel 5 are formed in the base plate 23. For each of the pressure chambers 10, a through hole forming the apertures 12, a communication hole between the pressure chamber 10 and the nozzles 8, and a communication holes between the ink supply ports 5*b* and the manifold channel 5 are formed in the aperture plate 24. For each of the pressure chambers 10, a communication hole between the aperture 12 and the sub-manifold channel 5*a*, and a communication hole between the pressure chamber 10 and the nozzle 8 are formed in the supply plate 25.

For each of the pressure chambers 10, a communication hole between the pressure chamber 10 and the nozzle 8, and through holes which are connected to each other during the lamination and form the manifold channel 5 and the sub-manifold channel 5*a* are formed in the manifold plates 26 to 28. For each of the pressure chambers 10, a communication hole between the pressure chamber 10 and the nozzle 8 is formed in the cover plate 29. For each of the pressure chambers 10, a hole facing the nozzle 8 is formed in the nozzle plate 30.

If these nine plates 22 to 30 are laminated while being aligned with each other, the channel unit 4 is formed. Each of the plates 22 to 30 is fixed by an adhesive, and an individual ink channel 31 shown in FIG. 4 is formed in the channel unit 4. Meanwhile, the individual ink channel 31 is a channel which reaches the nozzle 8 from the outlet of the sub-manifold channel 5*a*.

Through holes to form the pressure chambers 10 are formed in the cavity plate 22. As shown in FIG. 4, the through hole is provided between the upper surface of the base plate 23 and the lower surface of the actuator unit 20 in a vertical direction, so that the pressure chamber 10 is defined.

Figure 5A:
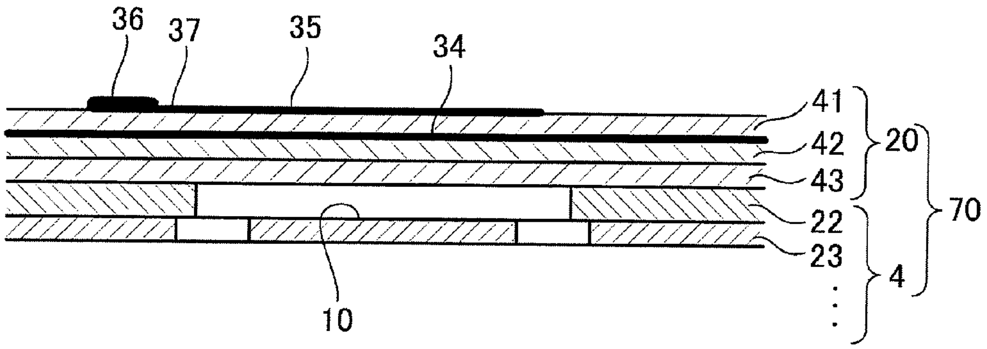
FIG. 5A is a cross-sectional view of a portion of the head body around a pressure chamber.

The actuator unit 20 will be described below. As shown in FIG. 5A, the actuator unit 20 includes three piezoelectric sheets 41 to 43, a plurality of individual electrodes 35 which are disposed on the upper surface of the piezoelectric sheet 41, and a common electrode 34 which is disposed between the piezoelectric sheets 41 and 42. The individual electrode 35, the piezoelectric sheet 41, the common electrode 34, the piezoelectric sheet 42, and the piezoelectric sheet 43 are laminated in this order from the side which is distant from the channel unit 4. The piezoelectric sheet 43 is attached to the upper surface of the channel unit 4 so as to close the opening of pressure chamber 10. Accordingly, the piezoelectric sheet 43 defines a wall surface of the pressure chamber 10.

Each of the piezoelectric sheets 41 to 43 is a flat plate which has the shape of a layer having a thickness of about 15 μm, and has shape and size covering one ink discharge region in plan view. Each of the piezoelectric sheets 41 to 43 is made of a lead zirconate titanate (PZT) ceramic material having ferroelectricity. Only the piezoelectric sheet 41 of the piezoelectric sheets 41 to 43 is polarized in a thickness direction thereof (the lamination direction of the piezoelectric sheets 41 to 43).

Figure 5B:
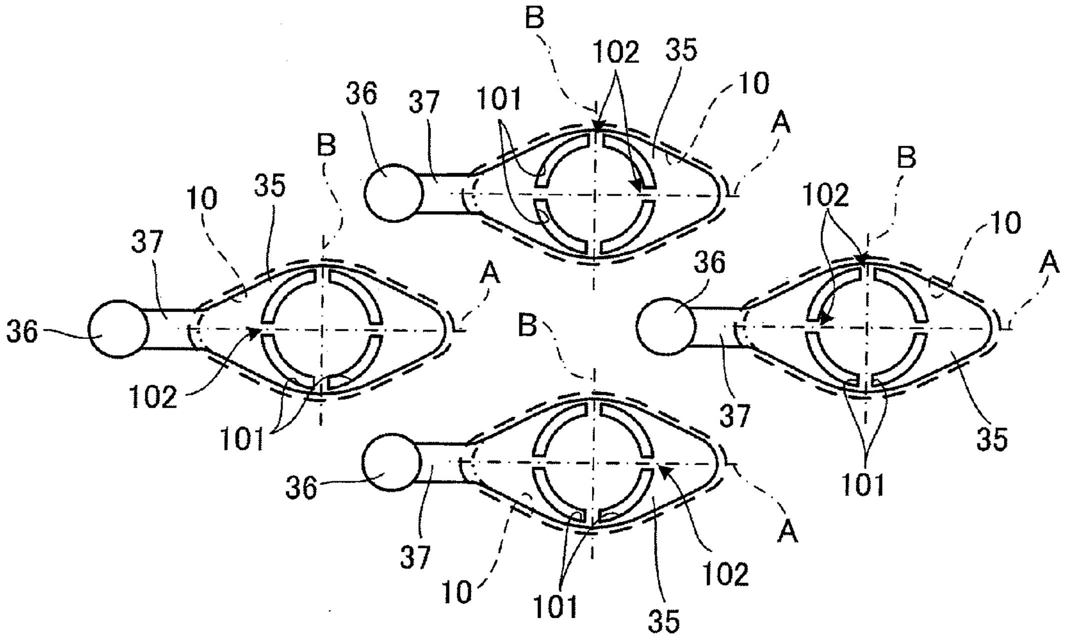
FIG. 5B is a plan view of a portion of the head body around the pressure chamber.

As shown in FIG. 5B, the individual electrode 35 has a rhombic shape, which has rounded corners and is substantially similar to the shape of the pressure chamber 10, in plan view, and is slightly smaller than the pressure chamber 10. In plan view, the centroid of the individual electrode 35 overlaps the centroid of the pressure chamber 10, and the individual electrode is disposed so that four sides of the individual electrode are parallel to four sides of the pressure chamber 10. In FIG. 5B, an intersection between dashed-dotted lines A and B indicates the position of the centroid of the individual electrode 35 and the position of the centroid of the pressure chamber 10. Accordingly, the individual electrode 35 is disposed at the center of the pressure chamber 10 so as to be included in the pressure chamber 10 in plan view.

In this exemplary embodiment, grooves 101 are formed in the individual electrode 35. The grooves 101 pass through the individual electrode 35 from the surface of the individual electrode, which faces the piezoelectric sheets 41 to 43, to an opposite surface of the individual electrode. Accordingly, regions of the upper surface of the piezoelectric sheet 41, which face the grooves 101, are exposed to the outside through the grooves 101. Meanwhile, if the grooves 101 are opened at the surface of the individual electrode 35 opposite to the surface facing the piezoelectric sheet 41, the grooves may not pass through the individual electrode 35.

In plan view, four grooves 101 are formed inside the outer peripheral edge of the individual electrode 35, and are formed along four arcs which have the same radius and have a center at the centroid of the individual electrode 35, respectively. Gaps among four grooves 101 are small, so that the four grooves 101 are formed along the entire circumference of a substantially complete circle as a whole. That is, the four grooves 101 substantially surround the centroid of the individual electrode 35.

Each of the grooves 101 of one individual electrode 35 extends in a direction crossing a direction from the centroid of the one individual electrode 35 another individual electrode 35 adjacent to the one individual electrode 35. For example, arrows C1 and C2 shown in FIG. 5B indicate directions from the centroid of one individual electrode 35*a* to adjacent individual electrodes 35, respectively. That is, the grooves 101 of the individual electrode 35*a* are formed so as to extend in a direction crossing the arrows C1 and C2.

Four connecting portions 102 which connect the region of the individual electrode 35 surrounded by the grooves 101 with the outer region thereof, are formed between the grooves 101. Accordingly, conduction is secured between the region which is surrounded by the grooves 101, and the region which is provided outside the region. Two connecting portions of the four connecting portion 102 are disposed on a straight line A which is parallel to the longitudinal direction of the individual electrode 35 and passes through the centroid of the individual electrode 35. The two connecting portions have a positional relationship which is symmetric with respect to the centroid of the individual electrode 35. Further, the other two connecting portions of the four connecting portions 102 are disposed on a straight line B which is parallel to the width direction of the individual electrode 35 and passes through the centroid of the individual electrode 35. The two connecting portions have a positional relationship which is symmetric with respect to the centroid of the individual electrode 35. In other words, the centroid of the individual electrode 35 is positioned at an intersection between a straight line connecting two connecting portions 102 of the four connecting portions 102 which are most distant from each other, and a straight line connecting the other two connecting portions 102.

Further, two connecting portions, which are disposed on the straight line B, of the four connecting portions 102 are disposed at positions which are close to the corners of the individual electrode 35. That is, these two connecting portions 102 are disposed at positions which face the corners of the pressure chamber 10.

An extension portion 37, which extends in the longitudinal direction of the individual electrode 35, is formed at one end of the individual electrode 35 in the longitudinal direction. Each of the individual electrode 35 and the extension portion 37 has a thickness of about 1 μm, and is made of a metal material such as Au system alloy. The extension portion 37 extends outside the pressure chamber 10, and a land 36 is formed at the end of the extension portion. Meanwhile, the land 36 has a circular shape having a diameter of about 160 μm in plan view, and is made of Ag—Pd system alloy. The land 36 is connected to a connection portion of wiring which is provided on the FPC 50, and the individual electrode 35 is connected to the driver IC 52, which is mounted on the FPC 50, by the land 36. The driver IC 52 supplies drive signals to respective individual electrodes 35, and individually controls the potentials of the individual electrodes 35.

The common electrode 34 has the same size as the piezoelectric sheet 41, and lies over all pressure chambers 10 belonging to one pressure chamber group 9. That is, the common electrode 34 faces all individual electrodes 35 which are formed at one actuator unit 20. Further, the common electrode 34 is grounded on a region (not shown, the upper surface of the piezoelectric sheet 41) through the FPC 50. Accordingly, the common electrode 34 is maintained at the same ground potential in the regions corresponding to all pressure chambers 10.

If the potential of the individual electrode 35 is different from the potential of the common electrode 34, an external electric field is generated in the region which is interposed between the individual electrode 35 and the common electrode 34. In this case, piezoelectric strain is generated in the region of the piezoelectric sheet 41, which is interposed between the individual electrode 35 and the common electrode 34, by the generation of the external electric field. As described above, an active portion where piezoelectric strain is generated is provided in the region of the piezoelectric sheet 41 which is interposed between the individual electrode 35 and the common electrode 34. Meanwhile, each of the piezoelectric sheets 42 and 43 is an inactive layer which does not include an active portion. The actuator unit 20 has a so-called unimorph type structure. Each of the portions, which are formed of the regions of the piezoelectric sheets 41 to 43 and the common electrode 34 facing the individual electrode 35 and the individual electrode 35, forms an actuator which applies discharge energy for each of the pressure chambers 10. The actuator unit 20 includes a plurality of individual actuators.

An operation when the actuator unit 20 is driven will be described below in detail. The driver IC 52 supplies a drive signal to the individual electrode 35 through the FPC 50. Accordingly, the potential of the individual electrode 35 is changed from the ground potential to a predetermined positive potential which is different from the ground potential, and then returns to the ground potential.

If the potential of the individual electrode 35 is changed to the predetermined positive potential, an electric field is generated between the individual electrode 35 and the common electrode 34. Accordingly, an external electric field, which is parallel to the lamination direction, is applied to the active portion of the piezoelectric sheet 41, so that the active portion is compressed in a direction orthogonal to the polarization direction by a lateral piezoelectric effect.

Meanwhile, since the other piezoelectric sheets 42 and 43 are not spontaneously compressed without the application of the external electric field, the other piezoelectric sheets function as a restrictive layer for restricting the active portion. Accordingly, unimorph deformation where the sheet protrudes toward the pressure chamber 10 occurs at the active portions of the piezoelectric sheets 41 to 43 and the portions facing the active portions, as a whole.

If the piezoelectric sheets 41 to 43 are deformed to protrude toward the pressure chamber 10, the volume of the pressure chamber 10 is decreased, so that the pressure of ink is increased. Accordingly, ink is discharged from the nozzle 8 that communicates with the pressure chamber 10. After that, when the potential of the individual electrode 35 returns to the ground potential, the shapes of the piezoelectric sheets 41 to 43 return to original shapes, so that the volume of the pressure chamber 10 also returns to original volume. Then, ink is suctioned from the sub-manifold channel 5*a* into the individual ink channel 31.

The following operation may be performed as another method of driving the actuator unit 20. The driver IC 52 previously sets the potential of the individual electrode 35 to a positive potential. In this case, the piezoelectric sheets 41 to 43 are in a state where unimorph deformation has previously occurred. Further, whenever discharge is required, the driver IC 52 sets the potential of the individual electrode 35 to the ground potential and then makes the potential of the individual electrode 35 return to a positive potential again at a predetermined timing. Accordingly, at a timing where the potential of the individual electrode 35 becomes the ground potential, the piezoelectric sheets 41 to 43 return to a state where deformation does not occur from a state where unimorph deformation has previously occurred. In this case, the volume of the pressure chamber 10 is increased, and ink is suctioned from the sub-manifold channel 5*a* into the individual ink channel 31. After that, at a timing where the potential of the individual electrode 35 becomes a positive potential again, the active portions of the piezoelectric sheets 41 to 43 and the portions facing the active portions are deformed to protrude toward the pressure chamber 10. Therefore, the volume of the pressure chamber 10 is decreased, so that the pressure of ink is increased and ink is discharged from the nozzle 8.

It is noted that, as described above, the individual electrode 35 is disposed at the center of the pressure chamber 10 so as to be included in the pressure chamber 10 in plan view, so that the center of the active portion of the piezoelectric sheet 41 is disposed at the center of the pressure chamber 10. The displacement of the piezoelectric sheets 41 to 43 is increased toward a position facing the vicinity of the center of the active portion, that is, the centroid of the individual electrode 35. Accordingly, if the center of the active portion is disposed at the center of the pressure chamber 10, it may be possible to efficiently apply pressure to the ink contained in the pressure chamber 10.

Figure 6A:
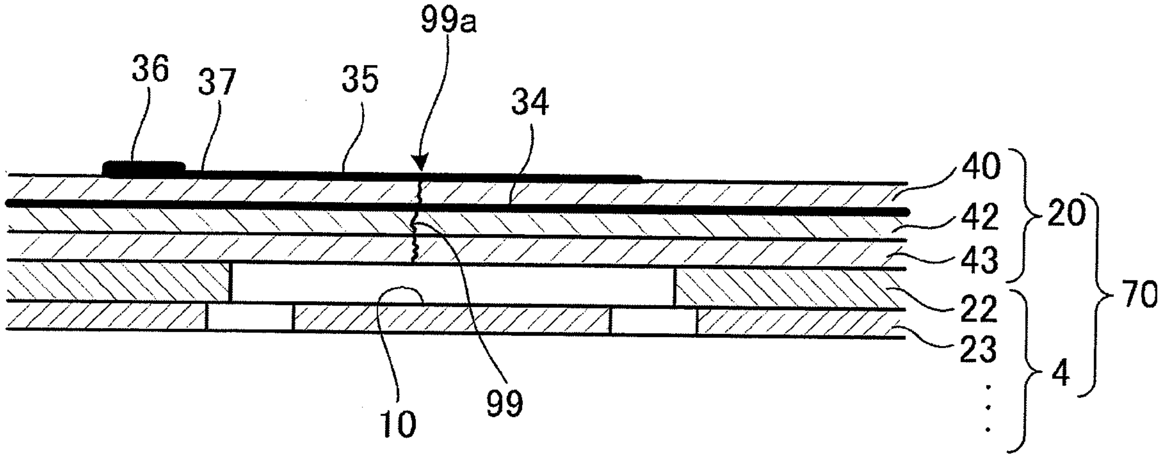
FIG. 6A is a view corresponding to FIG. 5A when a crack is generated in an actuator unit.

Meanwhile, a small crack may be generated at the individual electrode 35, the common electrode 34, or the piezoelectric sheets 41 to 43 due to circumstances during manufacture or use. The small crack hardly causes obstruction alone. However, if the actuator unit 20 continues to be driven plural times, the crack would grow due to the unimorph deformation of the piezoelectric sheets 41 to 43 and pass through the sheets or the electrode. If the crack is connected to another crack, the cracks reach the upper surface of the individual electrode 35 from the pressure chamber 10 like the crack 99 shown in FIG. 6A. If the above-described crack 99 is generated, the ink contained in the pressure chamber 10 leaks to the surface of the individual electrode 35 and reaches adjacent individual electrodes 35. Therefore, there is a concern that a short circuit is caused between electrodes.

Figure 6B:
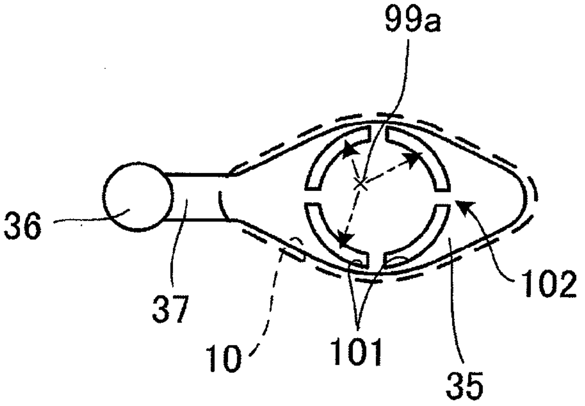
FIG. 6B is a plan view of an individual electrode when a crack is generated in the actuator unit.

In contrast, according to this exemplary embodiment, even though ink leaks from an opening 99*a* of the crack, which is opened to the upper surface of the individual electrode 35, in a direction which is indicated by an arrow shown by a dashed-dotted line, the ink does not reach adjacent individual electrodes 35 because flowing into the grooves 101 as shown in FIG. 6B. Accordingly, a short circuit, which is caused between the individual electrodes 35 by the leaked ink, is suppressed.

Further, as shown in FIG. 5B, each of the grooves 101 of this exemplary embodiment is formed so as to extend in a direction crossing a direction from the centroid of the individual electrode 35 to an adjacent individual electrode 35. Accordingly, it becomes sure to block the ink which leaks from the crack and approaches adjacent electrodes.

Furthermore, the grooves 101 of this exemplary embodiment are formed to substantially surround the centroid of the individual electrode 35. Meanwhile, in the vicinity of the centroid of the individual electrode 35, the amount of unimorph deformation is large as described above, a crack is relatively easily generated, and leakage of the ink occurs easily due to the cracks. Since the grooves 101 surround the above-described portion, it may be possible to more reliably suppress a short circuit of the electrode, which is caused by the leakage of ink.

Further, the grooves 101 are formed in the shape of an arc which has a center at the centroid of the individual electrode 35. Accordingly, it may be possible to cover a wide range in a circumferential direction, which corresponds to a center in the vicinity of the centroid, with relatively short grooves.

Furthermore, two connecting portions of the connecting portions 102 of this exemplary embodiment are disposed at positions which face the corners of the pressure chamber 10. In the vicinity of the position facing the corner of the pressure chamber 10, displacement is regulated by two side walls defining the corner, so that the amount of unimorph deformation is small. Accordingly, it is easy to avoid the cutting of the connecting portion 102 which is caused by the unimorph deformation.

Steps of manufacturing the ink jet head 1 according to this exemplary embodiment will be described below. In order to manufacture the ink jet head 1, components, such as the channel unit 4 and the actuator unit 20, are separately manufactured and assembled.

A step (Step S1) of manufacturing the channel unit 4 will be described first. Holes forming the ink channel of FIG. 4 are formed at the plates 22 to 29, respectively, by performing etching on the plates 22 to 29 of the plates 22 to 30 of the channel unit 4 except for the nozzle plate 30. In more detail, while a patterned photoresist is sued as a mask, holes forming the ink channel are formed by performing etching on the surface on which a resist is formed. A plurality of holes forming the nozzles 8 is formed at the nozzle plate 30 by a punch.

After that, nine plates 22 to 30, which are aligned so that holes forming the pressure chamber 10, holes forming the nozzle 8, or the like communicate with each other and form the individual ink channel 31, are laminated with an epoxy thermosetting adhesive therebetween. Further, the nine plates 22 to 30 are pressed while being heated up to a temperature not lower than the curing temperature of the thermosetting adhesive. Accordingly, the thermosetting adhesive is cured and the nine plates 22 to 30 are fixed to each other, so that the channel unit 4 shown in FIG. 4 is completed.

A step (Step S2) of manufacturing the actuator unit 20 will be described. First, a plurality of piezoelectric ceramic green sheets for forming the piezoelectric sheets 41 to 43 are prepared. The green sheets are formed in expectation of the amount of contraction caused by firing, in advance. Conductive paste is screen-printed on the surface of some of the green sheets so as to form a pattern of the common electrode 34.

After that, while the green sheets are aligned with each other, an unprinted green sheet is laminated so as to be interposed between the green sheets on which the conductive paste has been printed. If the laminated green sheet is fired, three green sheets form the piezoelectric sheets 41 to 43 and the conductive paste forms the common electrode 34.

Subsequently, conductive paste is screen-printed so as to form patterns of the individual electrode 35 and the extension portion 37 on the surface of the piezoelectric sheet 41 and is then fired, so that the individual electrode 35 is formed. In addition, Ag—Pd system alloy is printed on the extension portion 37, so that the land 36 is formed. Accordingly, the actuator unit 20 is completed.

Organic gold, which is apt to be formed in the shape of a thin film, is used as a material of conductive paste (printing paste) which is used to form an individual electrode 35 and an extension portion 37. Accordingly, it may be possible to form the thin individual electrode 35 and the thin extension portion 37 and to reduce errors during the measurement of the shapes of the individual electrode and the extension portion. Meanwhile, in the case of an Ag—Pd system alloy, Ag—Pd fine particles are mixed into the printing paste. In this case, even though fine particles are used as a raw material, the individual electrode and the extension portion need to be formed so as to be thick as compared to when organic metal is used as a raw material, in order to obtain predetermined electrical characteristics. As described above, printing paste, which uses fine particles and is used for forming a land, has limitations in terms of the reduction of measurement errors during the shape measurement. Accordingly, printing paste, which uses organic metal (organic gold in this case) as a raw material, is used.

Meanwhile, when being disposed on the channel unit 4, the actuator units 20 are formed so as to lie over all pressure chambers 10 belonging to one pressure chamber group 9. Accordingly, it is possible to densely arrange the individual electrodes 35 on the piezoelectric sheet 41 by using screen printing.

A step of attaching the actuator units 20 to the channel unit 4 will be described. When the actuator unit 20 is attached to the channel unit 4, the actuator units 20 and the channel unit 4 should be positioned so that the centroids of the pressure chambers 10 overlap the centroids of the individual electrodes 35 in plan view as shown in FIG. 5B. Accordingly, in this exemplary embodiment, the positions of the centroids of the pressure chambers 10 and the positions of the centroids of the individual electrodes 35 are previously acquired in order to position the actuator units 20 and the channel unit 4 (Steps S3 to S6).

Figure 8:
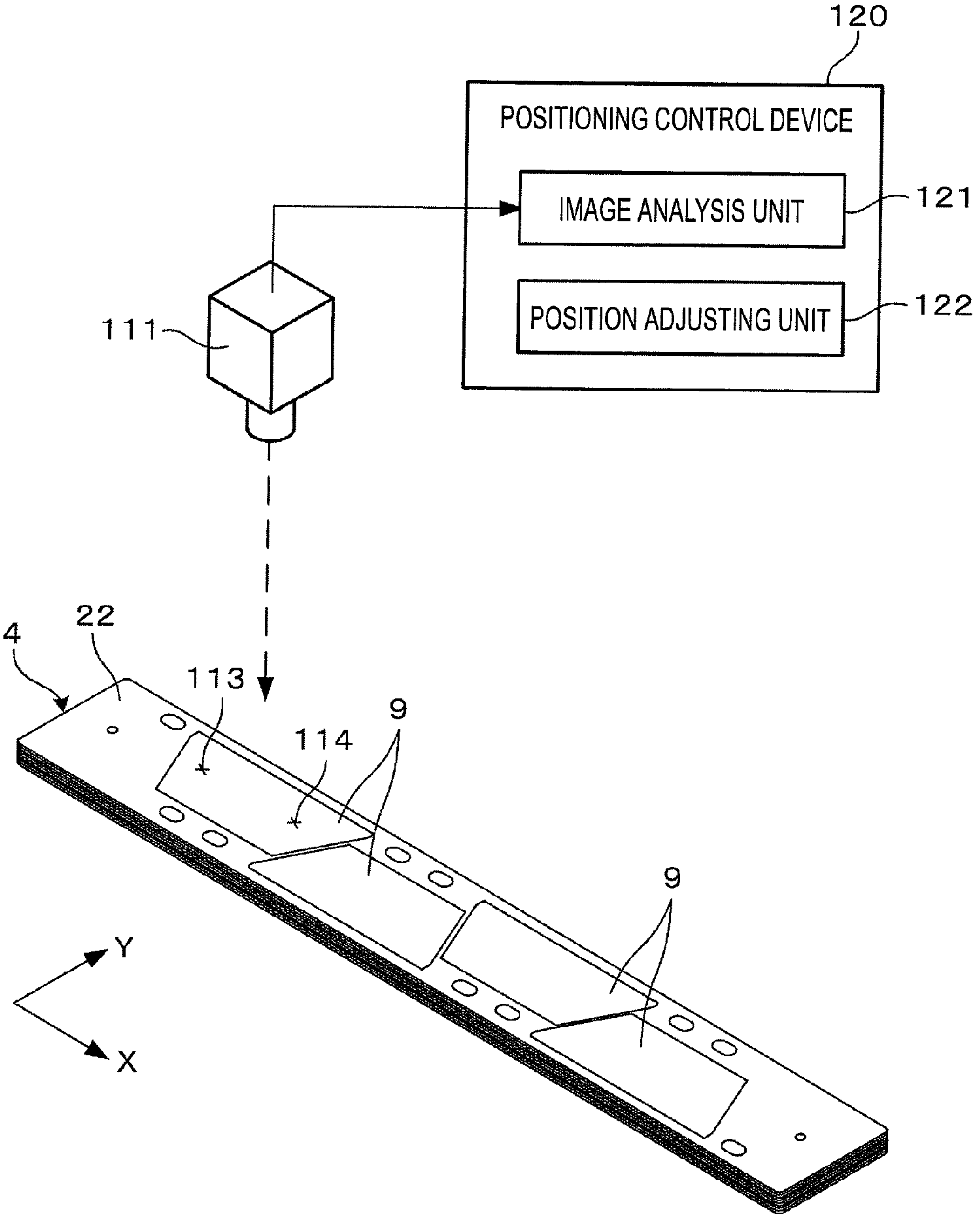
FIG. 8 is a perspective view of a channel unit when an image of the pressure chamber is taken by an image sensor.

A step of acquiring the positions of the centroids of the pressure chambers 10 is as follows: first, an image of the surface of the channel unit 4 to which the pressure chambers 10 are opened, that is, the surface of the cavity plate 22 is taken by an image sensor 111 as shown in FIG. 8 (Step S3; liquid chamber imaging step). For example, a Charge Coupled Device (CCD) image sensor, a Complementary Metal Oxide Semiconductor (CMOS) image sensor, or the like may be used as the image sensor 111.

The image sensor 111 takes an image of a region, which is used in positioning and includes pressure chambers 10, of each of four pressure chamber groups 9. In this exemplary embodiment, as an example, two pressure chambers 10 of each of the pressure chamber groups 9 are used in positioning. In FIG. 8, X marks 113 and 114 indicate the positions of the centroids of the two pressure chambers 10 of one pressure chamber group 9 which are used in positioning, respectively.

Image data, which correspond to the images taken by the image sensor 111, are sent to a positioning control device 120. The positioning control device 120 includes an image analysis unit 121 which analyzes the image data sent from the image sensor 111, and a position adjusting unit 122 which adjusts the position of the actuator unit 20 when the actuator unit 20 is positioned. The positioning control device 120 is formed of hardware, such as a processor circuit and a memory circuit, and software such as a program which causes the hardware function as the image analysis unit 121 and the position adjusting unit 122. The image analysis unit 121 acquires the positions of the centroids 113 and 114 of two pressure chambers 10 based on the image data sent from the image sensor 111 (Step S4; liquid chamber centroid acquiring step). The positions of the centroids 113 and 114 are acquired as the positions on an X-Y coordinate system which is set in a plane parallel to the upper surface of the channel unit 4.

A method of acquiring the position of the centroid of the pressure chamber 10 by the image analysis unit 121, is as follows: the pressure chamber 10 has a substantially rhombic shape as shown in FIG. 5B. The image analysis unit 121 acquires the outline of the pressure chamber 10 through image analysis, and acquires a linear region at the end of the pressure chamber 10. The linear region corresponds to a part of four sides of the rhombus. Further, the position of the centroid of the pressure chamber is acquired from the positional relationship between the four sides of the rhombus. Since the pressure chamber 10 is formed by performing etching as described above, the four sides of the rhombus are relatively accurately shown in the outline of the pressure chamber 10. Accordingly, the image analysis unit 121 can relatively accurately acquire the position of the centroid from the outline of the pressure chamber 10.

Figure 9:
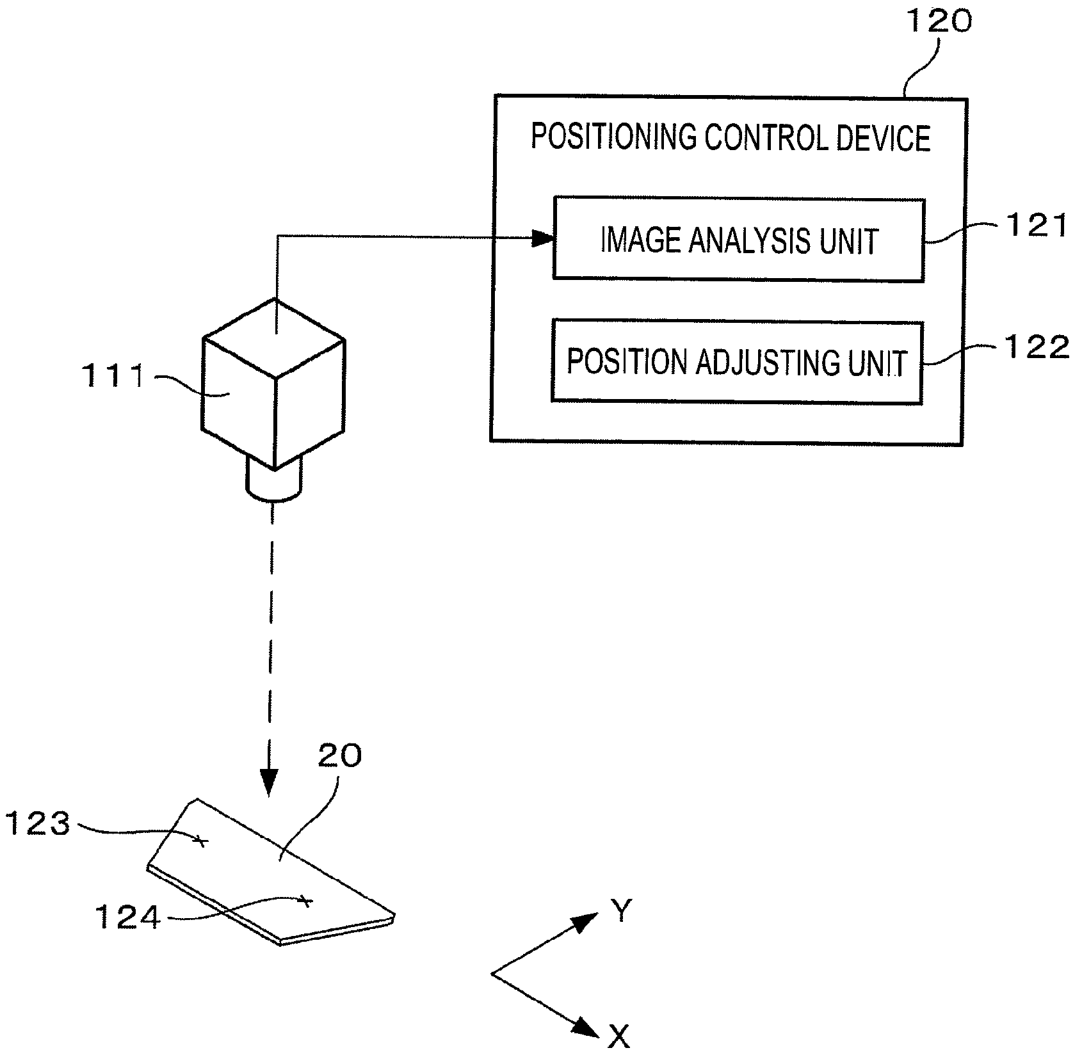
FIG. 9 is a perspective view of the actuator unit when an image of the individual electrode is taken by the image sensor.

Further, an image of the surface of the actuator unit 20 on which the individual electrode 35 is formed is taken by the image sensor 111 shown in FIG. 9 (Step S5; electrode imaging step). In this case, the actuator unit 20 is disposed along an X-Y plane which is parallel to the X-Y coordinate system. The image sensor 111 takes an image of a region, which includes two individual electrodes 35 corresponding to two pressure chambers 10 used in positioning, of the surface of each actuator unit 20. In FIG. 9, X marks 123 and 124 indicate the positions of the centroids of the two individual electrodes 35 corresponding to the two pressure chambers 10 which are used in positioning, respectively.

Image data, which correspond to the images taken by the image sensor 111, are sent to the image analysis unit 121. The image analysis unit 121 acquires the positions of the centroids of the two individual electrodes 35 based on the image data sent from the image sensor 111 as positions on the X-Y coordinate system (Step S6; electrode centroid acquiring step).

In this case, it is considered that the position of the centroid of the individual electrode 35 is acquired in the same manner as the pressure chamber 10. Since the individual electrode 35 also has a substantially rhombic shape like the pressure chamber 10 and a linear region of the outline of the individual electrode 35 can be accurately acquired, it is also possible to accurately acquire the position of the centroid of the individual electrode 35 from a positional relationship between the four sides of the rhombus.

However, the individual electrode 35 is formed by screen printing, unlike the pressure chamber 10. In the case of the screen printing, a printing plate extends or it may not be possible to secure sufficient printing accuracy. In this case, there are concerns that the individual electrode 35 is not accurately formed in an expected shape, and it may be difficult to recognize the linear region of the outline of the individual electrode 35 through image analysis. That is, since the individual electrode 35 has rounded corners, it is difficult to recognize which range is treated as a linear range unless the individual electrode is accurately formed in the expected shape.

Therefore, in this exemplary embodiment, the position of the centroid of the individual electrode 35 is acquired as follows: four connecting portions 102 are formed at the individual electrode 35 as shown in FIG. 5B. As described above, the centroid of the individual electrode 35 is positioned at an intersection between a straight line connecting two connecting portions 102 of the four connecting portions 102 which are most distant from each other and a straight line connecting the other two connecting portions 102. The image analysis unit 121 acquires the positions of the four connecting portions 102, and acquires the position of the centroid of the individual electrode 35 based on the relationship between the positions of the connecting portions 102 and the position of the centroid.

Alternatively, the image analysis unit 121 may acquire the position of the centroid of the individual electrode 35 based on the grooves 101 which are formed at the individual electrode 35. All of the grooves 101 are formed along arcs which have the same radius and have a center at the position of the centroid of the individual electrode 35. Accordingly, if the positions of three different points on the grooves 101 are acquired, it may be possible to acquire the position, which is equidistant from the three points, as the position of the centroid of the individual electrode 35. In this case, it is preferable that the three points be acquired from three different grooves 101 of the four grooves 101, respectively. Alternatively, the position of the centroid of the individual electrode may be acquired from the positions of four or more points.

Since the connecting portion 102 is a narrow region which is interposed between the grooves 101, it is easy to acquire an accurate position in image analysis. Further, even when a plurality of points on the grooves 101 is used, it is easy to recognize the groove 101 itself as compared to when the linear region of the outline of the individual electrode 35 is acquired. Therefore, it may be possible to accurately acquire the position of the centroid of the individual electrode 35 by using the connecting portions 102 or the grooves 101.

After that, a thermosetting adhesive is applied to the regions, on which the pressure chamber groups 9 are formed, of the upper surface of the channel unit 4 by using a bar coater (Step S7). Further, the channel unit 4 and the actuator units 20 are positioned based on the positions of the centroids of the pressure chambers 10 and the positions of the centroids of the individual electrodes 35, which are acquired in Steps S4 and S6 (Step S8).

Specifically, the position adjusting unit 122 adjusts the positions of the actuator units 20 based on the XY coordinates of the positions of the centroids which are acquired by the image analysis unit 121. The actuator units 20 are supported above the pressure chamber groups 9 by a jig, and the jig may move the actuator units 20 along an X-Y plane in directions which are indicated by arrows 131 to 135 of FIG. 10. The arrows 131 and 133 indicate translational movement in a direction parallel to an X direction (main scanning direction), the arrows 132 and 134 indicate translational movement in a direction parallel to a Y direction (sub-scanning direction), and the arrow 135 indicates rotational movement in the X-Y plane.

Figure 10:
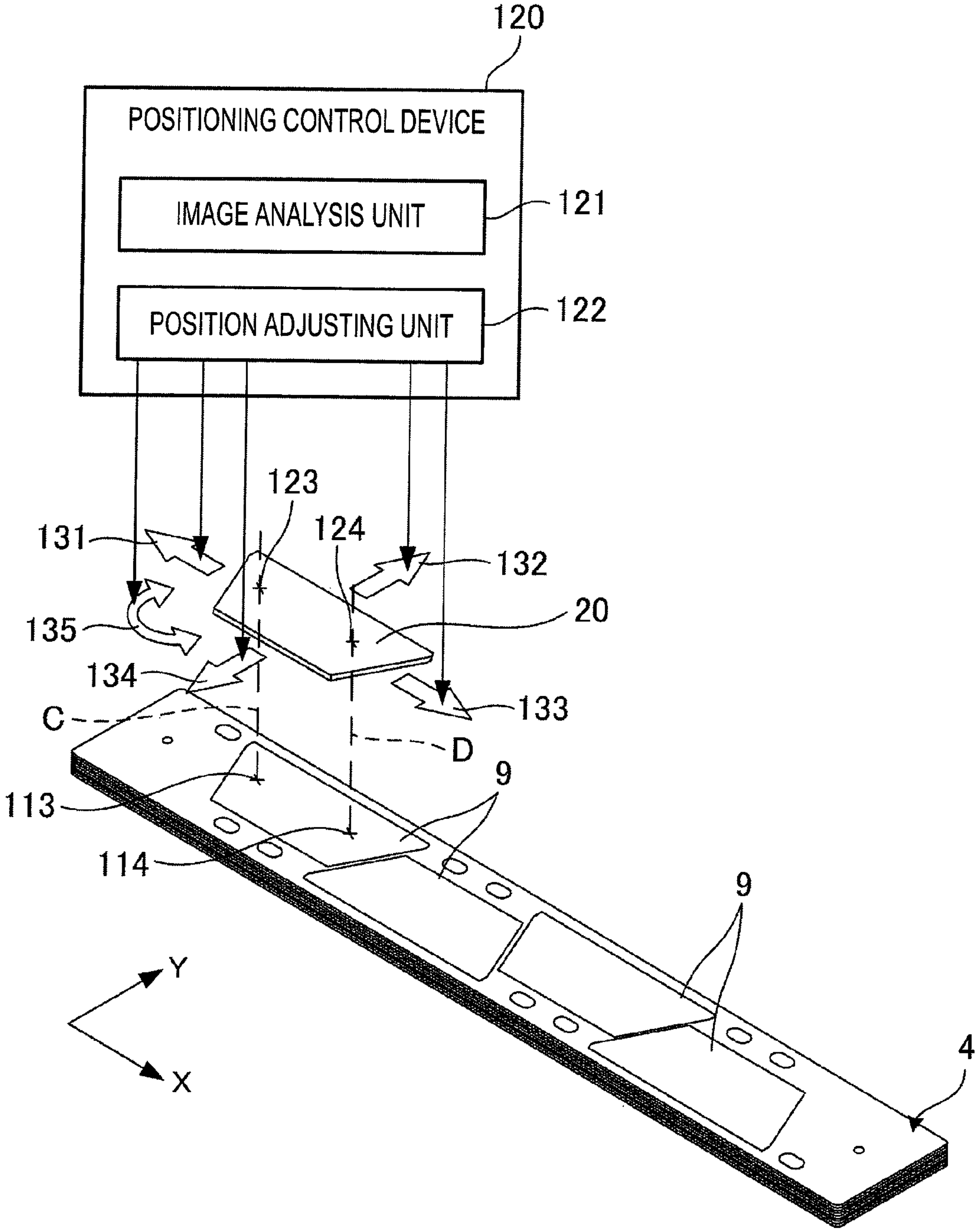
FIG. 10 is a perspective view of the actuator unit and the channel unit when the actuator unit and the channel unit are positioned.

The position adjusting unit 122 moves the actuator unit 20 to the jig so that the positions 123 and 124 of the centroids of the individual electrodes 35 and the positions 113 and 114 of the centroids of the pressure chambers 10 correspond to each other on the X-Y coordinate system. Accordingly, as shown in FIG. 10, the positions 113 and 123 of the centroids are disposed on an axis C perpendicular to the X-Y plane, and the positions 114 and 124 of the centroids are disposed on an axis D perpendicular to the X-Y plane.

After that, the jig supporting the actuator unit 20 moves the actuator unit 20 along the axes C and D, and places the actuator unit on the pressure chamber group 9. In this case, the actuator unit is positioned at Step S8 so that the positions of the centroids of the individual electrodes 35 and the positions of the centroids of the pressure chambers 10 overlap each other on the X-Y coordinate system. Accordingly, the actuator unit 20 is appropriately disposed so that the individual electrodes 35 and the pressure chambers 10 exactly have a positional relationship shown in FIG. 5B in plan view.

Then, a laminated body in which the channel unit 4 and the actuator unit 20 are laminated is pressed by a pressurizing device (not shown) while being heated up to a temperature not lower than the curing temperature of the thermosetting adhesive by a heating device (not shown). Accordingly, the channel unit 4 and the actuator unit 20 are attached to each other (Step S9).

According to the above-described manufacturing method, the actuator unit 20 and the channel unit 4 are manufactured, respectively, and the images of the pressure chambers 10 and the individual electrodes 35 are taken. Then, the positions of the respective centroids are acquired from the imaging results. Further, the actuator unit 20 and the channel unit 4 are positioned based on the acquired positions of the centroids. As described above, the actuator unit and the channel unit are positioned based on the position of the centroid after the positions of the centroids are actually measured. Accordingly, even though displacement occurs from a designed position during the formation of the individual electrode 35 or the pressure chamber 10, it may be possible to relatively accurately align the pressure chamber 10 with the individual electrode 35.

Hereinafter, a modification of a peripheral portion of the individual electrode will be described. Since the grooves 101 and the connecting portions 102 are formed at the individual electrode 35 in the above-described embodiment, it is easy to acquire the position of the centroid of the individual electrode 35 by using the grooves and the connecting portions. In addition, structures shown in FIGS. 11A to 14B may be considered as structures which make the position of a centroid be easily acquired.

Figure 11A:
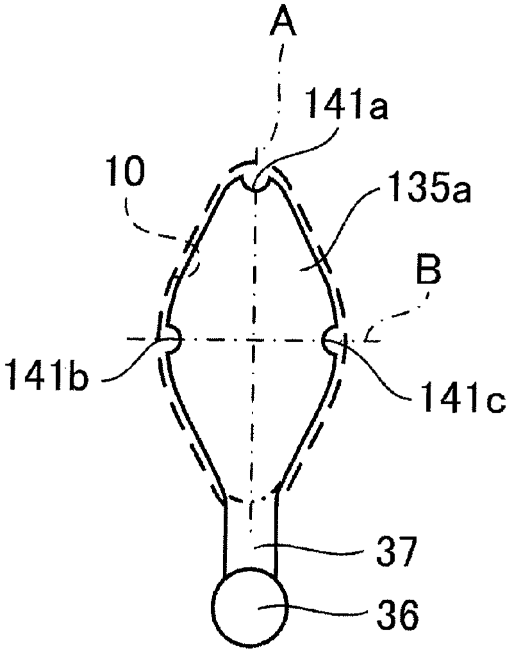
FIGS. 11A to 11D show modifications of a peripheral portion of the individual electrode.

Notches 141*a* to 141*c* are formed at the corners of a rhombic individual electrode 135*a* shown in FIG. 11A. The notches 141 are formed by notching portions near vertexes of the corners in a semicircular shape. The notch 141*a* is disposed on a straight line A which is parallel to a long diagonal line of the individual electrode 135*a*, and the notches 141*b* and 141*c* are disposed on a straight line B which is parallel to a short diagonal line. Further, an intersection between the straight lines A and B is the centroid of the individual electrode 135*a*. Accordingly, it may be possible to easily acquire the position of the centroid of the individual electrode 135*a* based on the notches 141*a* to 141*c*.

Figure 11B:
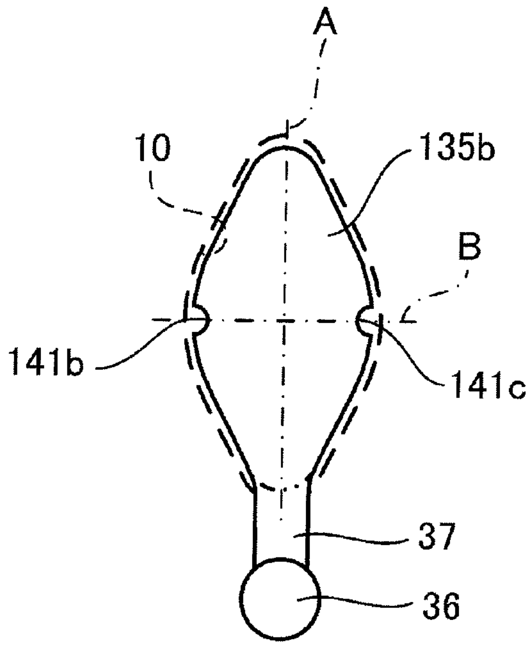

Further, as shown in FIG. 11B, in an individual electrode 135*b*, the notch 141*a* may not be formed at the individual electrode 135*a*. Even in this case, it may be possible to acquire the position of the centroid of the individual electrode 135*a* as a midpoint between the notches 141*b* and 141*c*. Meanwhile, the notches may be formed at positions on the outer peripheral edge of the individual electrode except for the corners.

Figure 11C:
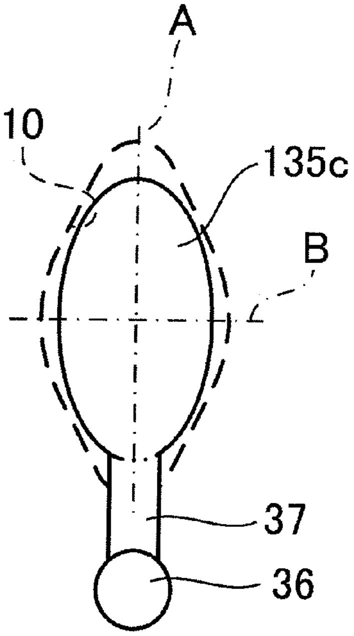

An individual electrode 135*c* shown in FIG. 11C has not a rhombic shape but an elliptical shape. Accordingly, like the case of a circular shape, it may be possible to calculate the centroid from the position coordinates of a plurality of measurement points set on the peripheral edge of the elliptical individual electrode. In this case, a centroid is calculated using coordinate values, which are obtained by image processing, by elliptic approximation that is based on a least-square method. As compared to at least a centroid obtained from a rhombic shape that has only portions corresponding to short straight lines, it may be possible to calculate a centroid with high positional accuracy.

Figure 11D:
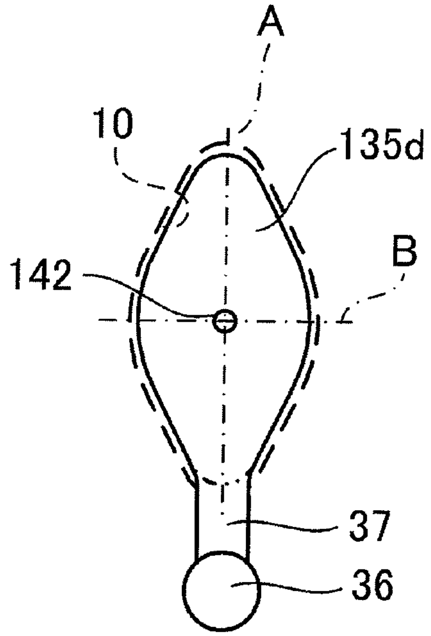

An individual electrode 135*d* shown in FIG. 11D includes a circular groove 142 which is formed at the position of the centroid thereof. Accordingly, it may be possible to directly acquire the position of the centroid of the individual electrode 135*d* by acquiring the position of the groove 142 through image analysis.

Figure 12A:
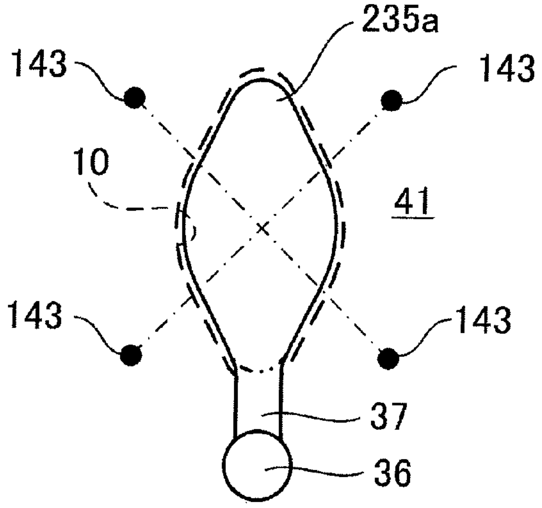
FIGS. 12A to 12C show other modifications of a peripheral portion of the individual electrode.

As shown in FIG. 12A, four markers 143 (indicating figures), which indicate the position of the centroid of an individual electrode 235*a*, are formed in the vicinity of the individual electrode 235*a* on the surface of a piezoelectric sheet 41. The markers 143 are disposed at vertexes of a rectangle that has a center at the position of the centroid of the individual electrode 235*a*. Accordingly, it may be possible to easily acquire the position of the centroid of the individual electrode 235*a* by acquiring the position of the intersection between the diagonal lines (dashed-dotted lines in FIG. 12A) of the rectangle that is defined by the markers 143. The markers 143 may be formed on the piezoelectric sheet 41 by screen printing, and may be formed simultaneously with the screen printing of the individual electrode 235*a*.

Figure 12B:
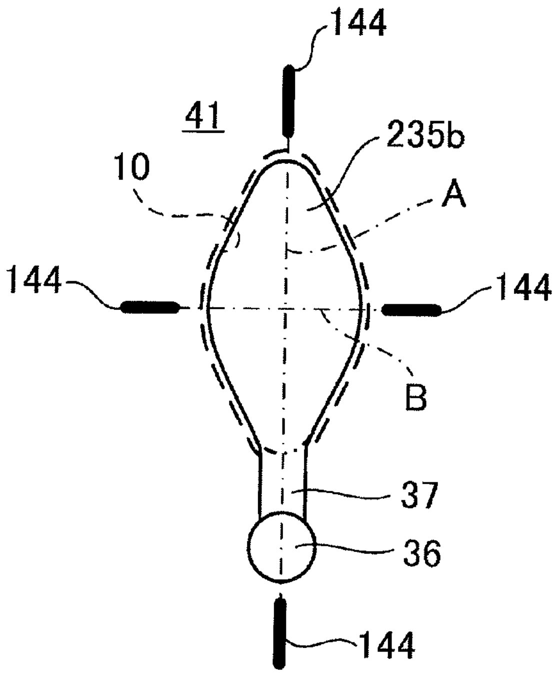
Figure 12C:
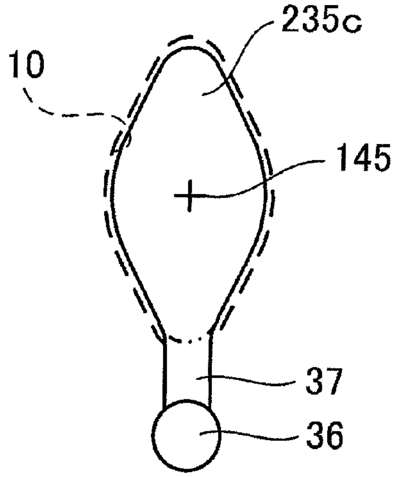

As shown in FIG. 12B, four markers 144, which indicate the position of the centroid of an individual electrode 235*b*, are formed in the vicinity of the individual electrode 235*b* on the surface of a piezoelectric sheet 41. Two of the four markers 144 are disposed on a straight line A which is parallel to a long diagonal line of the individual electrode 235*b*, and are formed in the shape of a line segment that is parallel to the straight line A. The other two markers are disposed on a straight line B that is parallel to a short diagonal line of the individual electrode 235*b*, and are formed in the shape of a line segment which is parallel to the straight line B. Accordingly, the respective markers 144 are formed so that the centroid of the individual electrode 235*b* is positioned on the extension line of the respective markers, and it is possible to easily acquire the position of the centroid of the individual electrode 235*b* based on the markers 144. The markers 144 may be formed on the piezoelectric sheet 41 by screen printing, and may be formed simultaneously with the screen printing of the individual electrode 235*b*.

Figure 13:
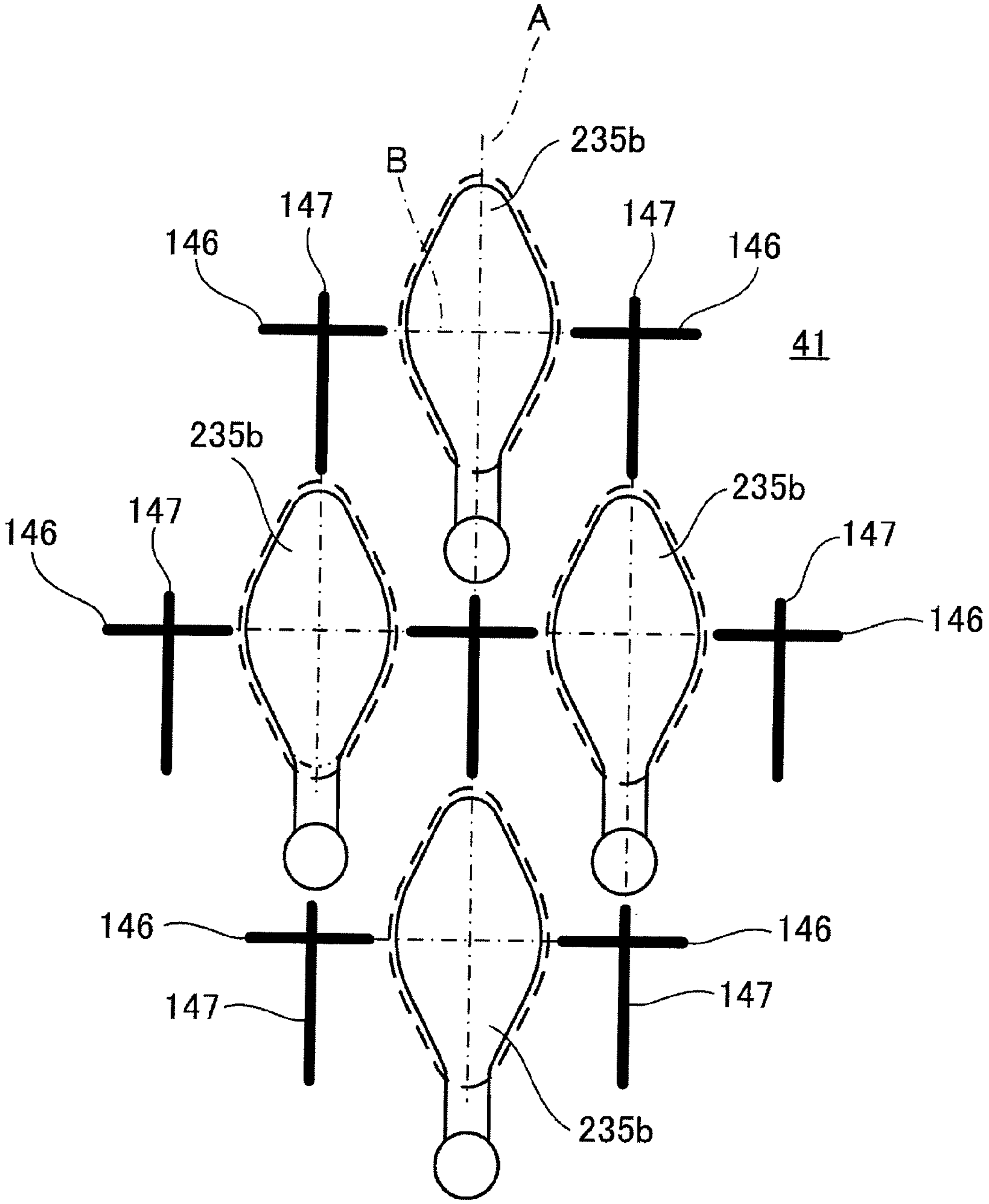
FIG. 13 shows a further modification of a peripheral portion of the individual electrode.

Meanwhile, between a plurality of individual electrodes 235*b* as well as in the vicinity of the individual electrode 235*b*, the above-described linear markers may be formed in a lattice shape as shown in FIG. 13. Markers 146 are formed parallel to a straight line B that is parallel to a short diagonal line of the individual electrode 235*b*, and markers 147 are formed parallel to a straight line A that is parallel to a long diagonal line of the individual electrode 235*b*. All of the markers 146 and 147 extend from the vicinity of one individual electrode 235*b* to the vicinity of another individual electrode 235*b* that is adjacent to the individual electrode 235*b*.

Returning to FIG. 12C, a cruciform marker 145 is formed on an individual electrode 235*c*. A cruciform intersection of the marker 145 is disposed at the position of a centroid of the individual electrode 235*c*. Accordingly, it may be possible to easily acquire the position of the individual electrode 235*c*. The marker 145 may be made of the same material as the individual electrode 235*c*, and may be made of a material different from the material of the individual electrode. For example, the marker 145 may be formed by screen printing metal paste, which is made of an Ag—Pd system alloy, so that a cruciform pattern is formed on an upper surface of the individual electrode 235*c*.

As described above, the centroids of the individual electrodes 235*a* to 235*c* are acquired based on the markers 143 to 145 that are formed on the electrodes or near the electrodes. The markers 143 to 145 are directly formed on the individual electrodes or formed close to the individual electrodes. Accordingly, even though displacement occurs during the formation of the individual electrode, change in the positional relationship between the markers and the centroid of the individual electrode is relatively small. Therefore, it may be possible to accurately acquire the position of the centroid of the individual electrode by using the markers.

Figure 14A:
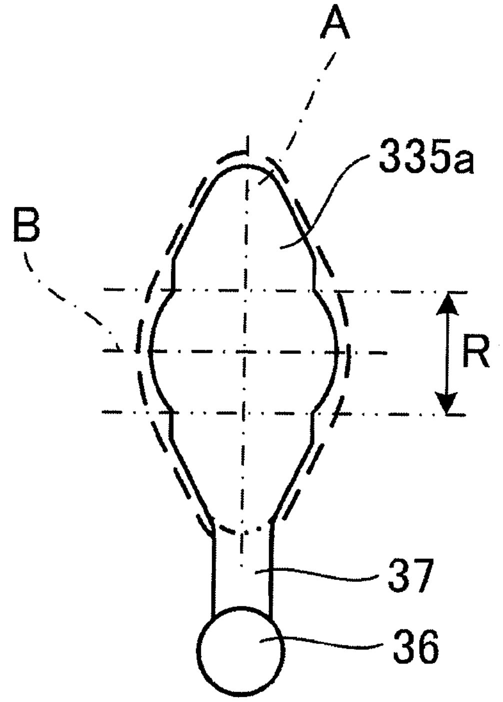
FIGS. 14A and 14B shows further modifications of a peripheral portion of the individual electrode.

An outer peripheral edge of a part of a region R of an individual electrode 335*a* shown in FIG. 14A is formed in the shape of an arc which has a center at the centroid of the individual electrode 335*a*. The outer peripheral edge of the region R is recognized and positions of three or more points on the outer peripheral edge are acquired in image analysis, so that it may be possible to easily acquire the position of the centroid of the individual electrode 335*a* as a position which is equidistant from these points.

Figure 14B:
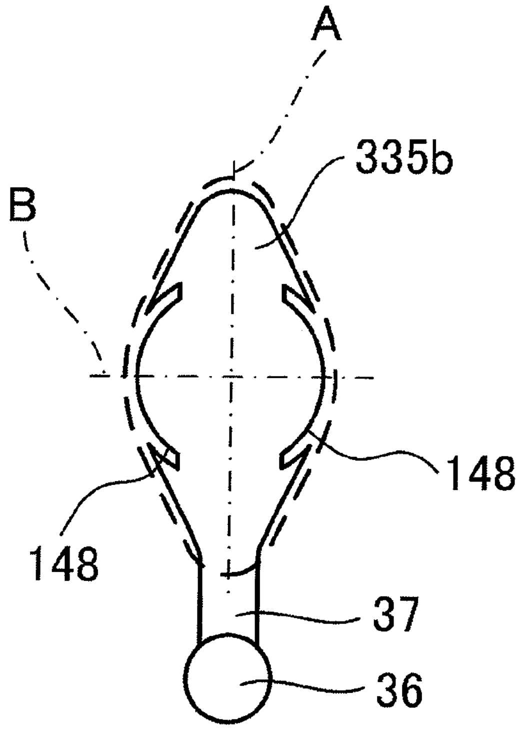

Grooves 148 are formed at an individual electrode 335*b* shown in FIG. 14B. Similar to the grooves 101, the grooves 148 are also formed in the shape of an arc which has a center at the centroid of the individual electrode 335*b*. However, the grooves are different from the above-described grooves 101 and extend to the outer peripheral edge of the individual electrode 335*b*. The outline of the groove 148 is recognized and positions of three or more points on the outline are acquired, so that it may be possible to easily acquire the position of the centroid of the individual electrode 335*b* as the position that is equidistant from these points. Meanwhile, in this case, a narrow electrode region may remain at the outer edge of an acute portion of the individual electrode 335*b*. Accordingly, even if ink leaks from the vicinity of the centroid through a crack, the leaking ink would not reach an adjacent individual electrode 335*b*.

Second Exemplary Embodiment

Figure 7:
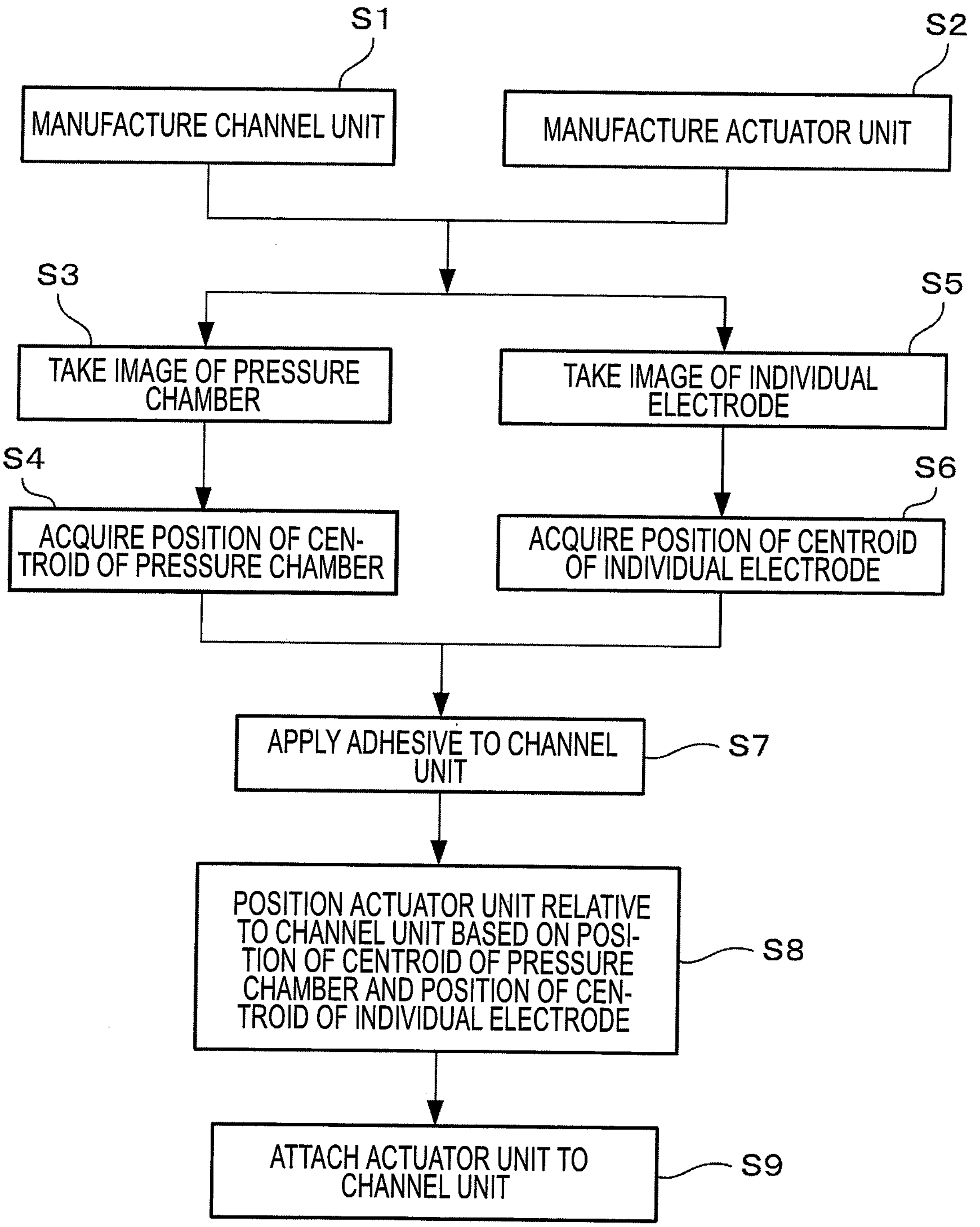
FIG. 7 is a flowchart illustrating a part of steps of manufacturing the ink jet head of FIGS. 1 to 5B.
Figure 15:
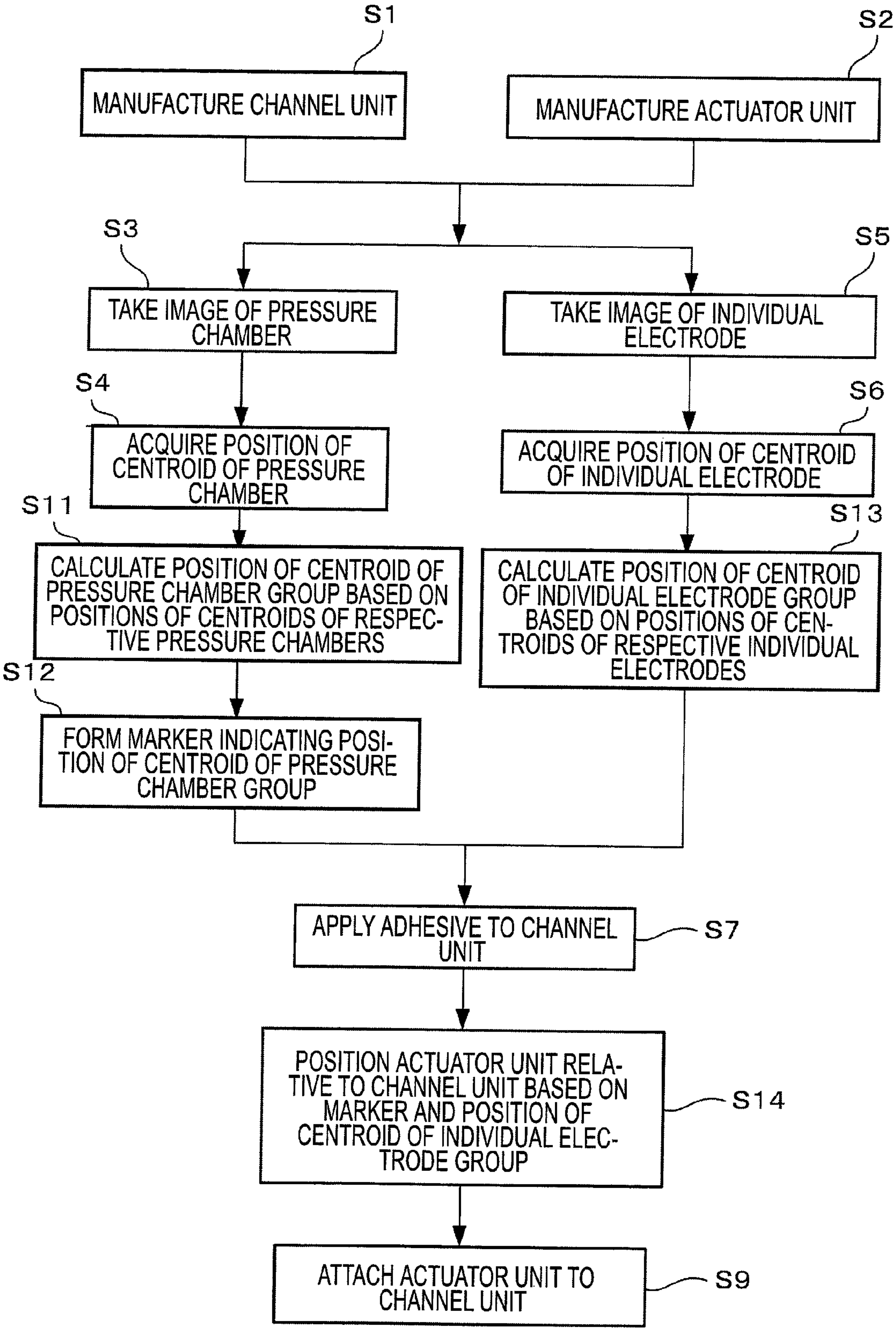
FIG. 15 is a flowchart illustrating a part of steps of manufacturing an ink jet head according to a second exemplary embodiment of the present invention.

A method of manufacturing an ink jet head 1 according to a second exemplary embodiment of the present invention will be described below with reference to FIG. 15. The flowchart of FIG. 15 includes partially the same steps as the flowchart of FIG. 7, and the same steps as the flowchart of FIG. 7 are denoted by the same step numbers.

First, a channel unit 4 and an actuator unit 20 are manufactured. Since Steps S1 to S6 of acquiring the positions of the centroids of a pressure chamber 10 and an individual electrode 35 are the same as those illustrated in the flowchart of FIG. 7, the descriptions thereof will be omitted. In the second exemplary embodiment also, as in the first exemplary embodiment, a positioning control device 120 acquires the positions of the centroids of the pressure chamber 10 and the individual electrode 35, and positions the channel unit 4 and the actuator unit 20 based on these positions of the centroids.

However, in the second exemplary embodiment, an image analysis unit 121 acquires the positions of the centroids of all pressure chamber group 9 for each pressure chamber group 9 (Step S11). The position of the centroid of each pressure chamber group 9 is derived based on the positions of the centroids, which are acquired in Step S4, of a plurality of pressure chambers 10 belonging to the pressure chamber group 9. For example, the image analysis unit 121 may obtain the position of the centroid of the pressure chamber group 9 from the positions of the centroids of four pressure chambers 10 which are positioned at four vertexes of the trapezoidal pressure chamber group 9. Alternatively, it may be possible to obtain the position of a centroid of the pressure chamber group 9 by acquiring the positions of the centroids of all pressure chambers 10 included in the pressure chamber group 9.

After that, a marker forming device (not shown) forms markers, which indicate the position of a centroid of the pressure chamber group 9, based on the position of the centroid of the pressure chamber group 9 which is acquired by the image analysis unit 121 (Step S12). Markers 151, which are examples of the above-described markers, are shown in FIG. 16. Two markers 151 are disposed at positions, between which the pressure chamber group 9 is interposed in a main scanning direction, on an upper surface of the channel unit 4, that is, on an upper surface of a cavity plate 22. The positions of two markers 151 are adjusted so that the midpoint of a line segment connecting the two markers is disposed at the position of the centroid of the pressure chamber group 9.

Meanwhile, the image analysis unit 121 acquires the position of a centroid of an individual electrode group including all the individual electrodes 35 formed at one actuator unit 20, for each actuator unit 20 (Step S13). The position of the centroid of the individual electrode group is derived based on the positions of the centroids, which are acquired in Step S6, of a plurality of individual electrodes 35 belonging to the individual electrode group.

Figure 16A:
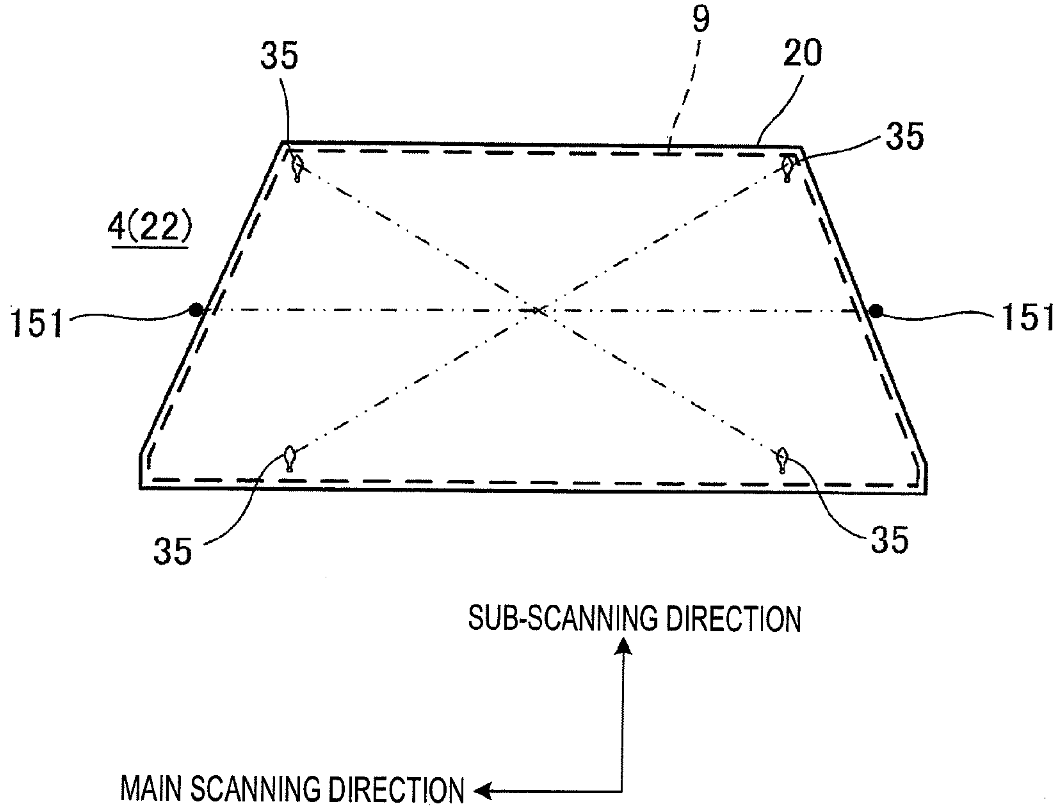
FIGS. 16A and 16B are plan views of a channel unit and an actuator unit when a pressure chamber group and the actuator unit are positioned in steps of manufacturing the ink jet head according to the second embodiment.

Four individual electrodes 35 of FIG. 16A show an example of the combination of individual electrodes 35 which is used to acquire the position of the centroid of the individual electrode group. The four individual electrodes 35 shown in FIG. 16A are selected so that the centroids of the four individual electrodes are positioned at vertexes of a rectangle that has a center at the position of the centroid of the individual electrode group. Accordingly, it may be possible to easily acquire the positions of the centroids of all individual electrode groups, which are included in one actuator unit 20, by acquiring the positions of the centroids of four individual electrodes 35 and acquiring an intersection between the diagonal lines of a rectangle which is defined by these positions of the centroids of the individual electrodes. Meanwhile, the four individual electrodes 35, which are used to acquire the position of a centroid of the individual electrode group, may be preferably selected so that a rectangle having the positions of the centroids of the four individual electrodes 35 as vertexes is the largest rectangle to be taken from one actuator unit 20.

Figure 16B:
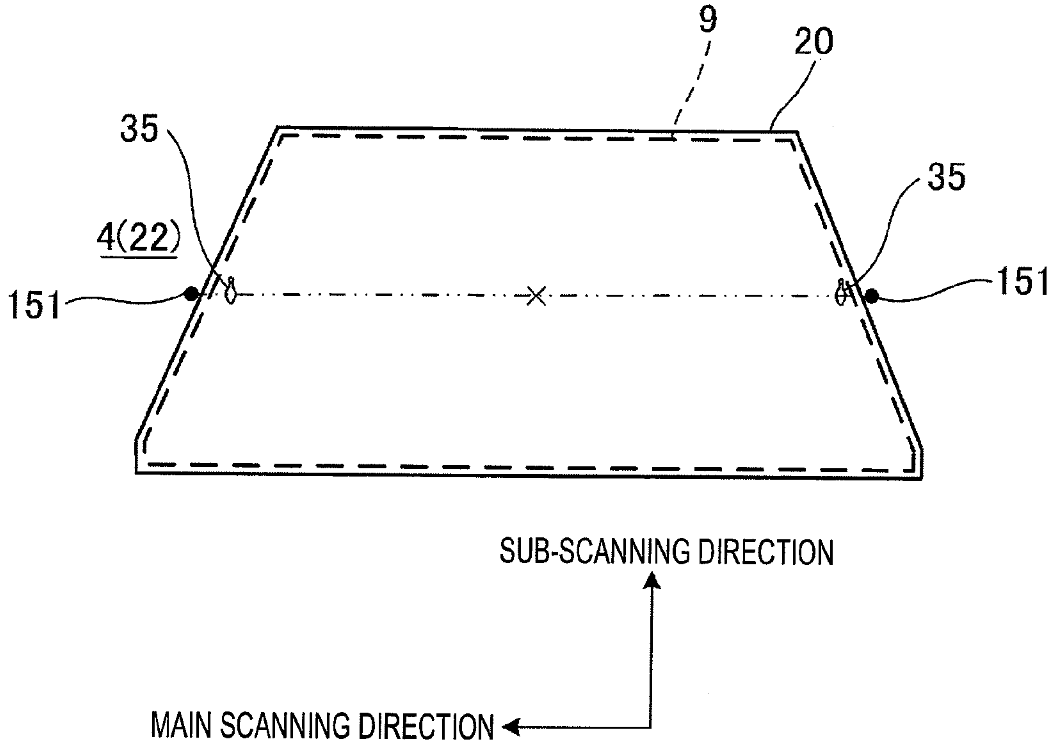

As shown in FIG. 16B, the position of the centroid of the individual electrode group may be acquired based on the positions of the centroids of two individual electrodes 35. The two individual electrodes 35 shown in FIG. 16B are selected so that the midpoint of a line segment connecting the two individual electrodes corresponds to the centroid of the individual electrode group (the position shown by an X mark in FIG. 16B). Further, the two individual electrodes 35 are disposed to be positioned on a line segment that connects two markers 151. Accordingly, it may be possible to acquire the position of the centroid of the individual electrode group by acquiring the middle position between two individual electrodes based on the positions of the centroids of the two individual electrodes 35.

Subsequently, after a thermosetting adhesive is applied to the channel unit 4 (Step S7), the actuator unit 20 and the channel unit 4 are positioned based on the markers 151 formed in Step S12 and the position of the centroid of the individual electrode group acquired in Step S13 (Step S14). That is, the position of the actuator unit 20 is adjusted with respect to the channel unit 4 so that the position of the centroid of the individual electrode group, which is obtained from the position of the centroid of four individual electrodes 35, corresponds to the position of the centroid of the pressure chamber group 9 that is indicated by the marker 151.

Specifically, the actuator unit 20 is placed on the channel unit 4 so that an intersection between the diagonal lines (two-dot chain lines) of a rectangle, which is defined by the four individual electrodes 35, corresponds to the position of the midpoint of a line segment (two-dot chain line) connecting two markers 151 as shown in FIG. 16A. Alternatively, the actuator unit 20 is placed on the channel unit 4 so that a midpoint of a line segment (two-dot chain line) connecting the positions of the centroids of two individual electrodes 35 corresponds to the midpoint of a line segment (two-dot chain line) connecting two markers 151 as shown in FIG. 16B.

Further, the channel unit 4 and the actuator unit 20 are attached to each other by pressing a laminated body of the channel unit 4 and the actuator unit 20 together while the laminated body is heated (Step S15).

The markers 151 of the second exemplary embodiment are formed on the surface of the channel unit 4 except for a region on which the actuator unit 20 is attached. Accordingly, even when the pressure chamber group 9 hides behind the actuator unit 20 after the actuator unit 20 is attached to the upper surface of the channel unit 4, it may be possible to acquire the position of the centroid of the pressure chamber group 9 by using the markers 151.

<Other Modifications>

While the present invention has been shown and described with reference to certain exemplary embodiments thereof, it will be understood by those skilled in the art that various changes in form and details may be made therein without departing from the spirit and scope of the invention as defined by the appended claims.

For example, in the above-described exemplary embodiments, the actuator unit 20 and the channel unit 4 have been positioned based on the positions of the centroids of two to four individual electrodes 35. However, the positions of the centroids of more individual electrodes 35 may be acquired, and positioning may be performed based on the positions of the centroids of more individual electrodes.

Further, in the above-described exemplary embodiments, positioning is performed so that the centroid of the pressure chamber 10 and the centroid of the individual electrode 35 overlap each other in plan view. However, as long as the centroids of the pressure chamber and the individual electrode are positioned so that the individual electrode 35 faces the pressure chamber 10, the centroid of the pressure chamber 10 and the centroid of the individual electrode 35 may be positioned to have another positional relationship. For example, the position of the centroid of the individual electrode 35 may be positioned to slightly deviate from the centroid of the pressure chamber 10 to the left side in FIG. 5B.

Furthermore, in the above-described exemplary embodiments, the actuator unit 20 is positioned after the manufacture of the channel unit 4. However, before the cavity plate 22 is attached to another plate 23 or the like after being formed, the cavity plate 22 and the actuator unit 20 may be positioned and attached to each other.

Further, in the above-described exemplary embodiments, the position of the centroid of the individual electrode is acquired based on the grooves formed on the individual electrode, the markers formed in the vicinity of the individual electrode, or the like. However, if the position of the centroid of the individual electrode may be acquired simply by the rhombic shape of the individual electrode even though the grooves or markers are not formed on the surface of the individual electrode or in the vicinity of the individual electrode, it is not necessary to form the grooves or markers.

Furthermore, in the above-described exemplary embodiments, the present invention has been applied to an ink jet head that discharges ink from nozzles. However, the object to which the present invention may be applied is not limited to the ink jet head. For example, the present invention may be applied to a droplet discharge head that forms fine wiring patterns on a substrate by discharging conductive paste, forms a high-definition display by discharging an organic luminescent material onto a substrate, or forms a microelectronic device such as an optical waveguide by discharging an optical resin onto a substrate.

What is claimed is:

1. A method of making an electronic droplet discharge head that includes positioning a channel forming member and an actuator unit, the channel forming member including a liquid chamber which communicates with a discharge port through which a droplet is discharged, the liquid chamber having an opening being opened to a surface of the channel forming member, the actuator unit including an electrode disposed on a surface thereof, the actuator unit being configured to apply discharge energy to liquid contained in the liquid chamber to be discharged from the discharge port when a drive signal is supplied to the electrode, the positioning being performed with respect to a surface direction so that the electrode faces the liquid chamber in a facing direction orthogonal to the surface direction, the positioning method comprising:

taking an image of the opening of the liquid chamber;

acquiring a position of a centroid of the liquid chamber in the surface direction based on the taken image of the opening;

taking an image of the electrode;

acquiring a position of a centroid of the electrode in the surface direction based on the taken image of the electrode; and positioning the channel forming member and the actuator unit based on the position of the centroid of the liquid chamber and the position of the centroid of the electrode so that the liquid chamber and the electrode has a positional relationship in the surface direction.

2. The method according to claim 1, wherein the actuator unit includes a plurality of electrodes disposed on the surface thereof, wherein the channel forming member includes a plurality of liquid chambers, each including an opening opened to the surface of the channel forming member, and wherein the channel forming member and the actuator unit are positioned based on positions of the centroids of the respective liquid chambers and positions of the centroids of the respective electrodes.

3. The method according to claim 1, wherein a groove is formed on a surface of the electrode as seen in the facing direction, and wherein the position of the centroid of the electrode is acquired based on a position of the groove.

4. The method according to claim 3, wherein the groove of the electrode extends along an arc with the centroid of the electrode as a center.

5. The method according to claim 4, wherein the groove of the electrode is formed at substantially an entire circumference of a circle with the centroid of the electrode as a center.

6. The method according to claim 1, wherein a part of an outer peripheral edge of the electrode is formed along an arc with the centroid of the electrode as a center as seen in the facing direction, and wherein the position of the centroid of the electrode is acquired based on a position of the outer peripheral edge formed along the arc.

7. The method according to claim 1, wherein a notch portion is formed at an outer peripheral edge of the electrode as seen in the facing direction, and wherein the position of the centroid of the electrode is acquired based on the position of the notch portion.

8. The method according to claim 1, wherein the actuator unit includes a plurality of electrodes disposed on the surface thereof, wherein the actuator unit includes indicating figures which indicate positions of the centroids of the electrodes, respectively, each of the indicating figures being formed close to the corresponding electrode or on the surface of the corresponding electrode, and wherein the centroids of the respective electrodes are acquired based on the indicating figures.

9. The method according to claim 1, further comprising forming an indicating figure which indicates the position of the centroid of the liquid chamber on the surface of the channel forming member on which the liquid chambers are formed, based on the position of the acquired centroid of the liquid chamber.

10. The method according to claim 9, wherein the indicating figure is formed at a region which does not face the actuator unit.

11. The method according to claim 2, wherein the acquiring the position of the centroid of the liquid chamber includes acquiring a position of a centroid of a liquid chamber group including the plurality of liquid chambers based on positions of the centroids of the respective liquid chambers, wherein the acquiring the position of the centroid of the electrode includes acquiring a position of a centroid of an electrode group including the plurality of electrodes based on positions of the centroids of the respective electrodes corresponding to the liquid chambers, and wherein the positioning of the channel forming member and the actuator unit is performed based on the position of the centroid of the liquid chamber group and the position of the centroid of the electrode group.

12. The method according to claim 2, wherein the acquiring the position of the centroid of the liquid chamber includes acquiring a position of a centroid of a liquid chamber group including the plurality of liquid chambers based on the positions of the centroids of the respective liquid chambers, the positioning method further comprising forming an indicating figure which indicates the position of the centroid of the liquid chamber group on the surface of the channel forming member on which the liquid chambers are formed, wherein the acquiring the position of the centroid of the electrode includes acquiring a position of centroid of an electrode group including the plurality of electrodes based on the positions of the centroids of the respective electrodes corresponding to the liquid chambers, and wherein the positioning of the channel forming member and the actuator unit is performed based on the position of the centroid of the electrode group and the indicating figure.

13. The method according to claim 1, wherein the taking the image of the opening of the liquid chamber is performed by an image sensor.

* * * * *